United States Patent
Cioffi et al.

(10) Patent No.: US 7,657,818 B2
(45) Date of Patent: Feb. 2, 2010

(54) DYNAMIC MINIMUM-MEMORY INTERLEAVING

(75) Inventors: John M. Cioffi, Atherton, CA (US); Georgios Ginis, San Francisco, CA (US)

(73) Assignee: Adaptive Spectrum and Signal Alignment, Inc., Redwood City, CA (US)

( * ) Notice: Subject to any disclaimer, the term of this patent is extended or adjusted under 35 U.S.C. 154(b) by 760 days.

(21) Appl. No.: 11/363,769

(22) Filed: Feb. 28, 2006

(65) Prior Publication Data

US 2007/0011559 A1    Jan. 11, 2007

Related U.S. Application Data

(60) Provisional application No. 60/692,889, filed on Jun. 22, 2005.

(51) Int. Cl.
*H03M 13/00* (2006.01)
(52) U.S. Cl. .......................... 714/755; 714/763
(58) Field of Classification Search .................. 370/412, 370/413; 711/5, 157; 714/702, 755, 763
See application file for complete search history.

(56) References Cited

U.S. PATENT DOCUMENTS

| | | | |
|---|---|---|---|
| 4,547,887 A | | 10/1985 | Mui |
| 4,901,319 A | | 2/1990 | Ross |
| 5,042,033 A | | 8/1991 | Costa |
| 5,056,105 A | | 10/1991 | Darmon et al. |
| 5,537,420 A | | 7/1996 | Huang |
| 5,572,532 A | * | 11/1996 | Fimoff et al. ............... 714/702 |
| 5,764,649 A | | 6/1998 | Tong |
| 6,229,812 B1 | * | 5/2001 | Parruck et al. ............... 370/412 |
| 6,421,796 B1 | | 7/2002 | Gatherer |
| 6,651,194 B1 | | 11/2003 | Huang et al. |
| 6,697,975 B2 | | 2/2004 | Cameron |
| 6,745,277 B1 | * | 6/2004 | Lee et al. .................. 711/5 |

(Continued)

FOREIGN PATENT DOCUMENTS

EP        0 856 949 B1     8/1998

(Continued)

OTHER PUBLICATIONS

International Search Report, International Application No. PCT/IB2006/000629 (3 pgs), date: Sep. 11, 2006.

(Continued)

*Primary Examiner*—David Ton
(74) *Attorney, Agent, or Firm*—Blakely, Sokoloff, Taylor & Zafman, LLP

(57) ABSTRACT

Minimum-memory-implementation is available with any depth and period in DSL interleaving/deinterleaving, always allowing the minimum amount of memory to be used in both transmitter and receiver without loss of performance or of basic triangular structure, even if the interleaver/deinterleaver parameters change dynamically. A novel cell-scheduling process ensures availability of the minimum amount of memory (or any other desired memory usage) to implement an image of the perfect triangle and works for any co-prime depth and interleaver period. Minimal memory use may be further characterized by a simple off-line method that determines an addressing order for each of the memory cells in a minimum-memory (or other) implementation of an interleaver/deinterleaver according to the invention. Time variation of interleaver depth in operation can be accommodated easily with absolute minimum memory requirement at all time instants.

20 Claims, 14 Drawing Sheets

U.S. PATENT DOCUMENTS

| | | | |
|---|---|---|---|
| 6,772,377 | B2 | 8/2004 | Chow |
| 6,785,862 | B1 | 8/2004 | Zhang |
| 6,823,002 | B1 | 11/2004 | Betts |
| 6,853,643 | B1 * | 2/2005 | Hann et al. ............ 370/413 |
| 6,874,070 | B2 * | 3/2005 | Gupta et al. ............ 711/157 |
| 7,529,984 | B2 * | 5/2009 | Heise ............ 714/701 |
| 2003/0021338 | A1 | 1/2003 | Mazzoni et al. |
| 2004/0117713 | A1 | 6/2004 | Cameron |
| 2005/0094677 | A1 | 5/2005 | Lu et al. |
| 2006/0150059 | A1 | 7/2006 | Modlin |
| 2006/0153285 | A1 | 7/2006 | Modlin |

FOREIGN PATENT DOCUMENTS

| | | |
|---|---|---|
| EP | 1022859 | 7/2000 |

OTHER PUBLICATIONS

Written Opinion of the International Searching Authority, International Application No. PCT/IB2006/000629 (12 pgs), fax date: Mar. 27, 2007.

* cited by examiner

DYNAMIC MINIMUM-MEMORY INTERLEAVING

CROSS-REFERENCE TO RELATED APPLICATIONS

This application claims the benefit of priority under 35 U.S.C. § 119(e) of the following:

U.S. Provisional Ser. No. 60/692,889 filed on Jun. 22, 2005, entitled MINIMUM-MEMORY INTERLEAVING SYSTEM, the entire disclosure of which is incorporated herein by reference in its entirety for all purposes.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISK APPENDIX

Not applicable.

BACKGROUND

1. Technical Field

This invention relates generally to methods, systems and apparatus for digital communications systems.

2. Description of Related Art

Digital communications system transmitters use modules known as interleavers and corresponding receiver modules known as deinterleavers. In Digital Subscriber Line (DSL) systems, these modules are used to increase the systems' coding gain and to improve their impulse noise correction capability. These improvements allow reliable transmission of information at data rates higher than those achievable without interleaver/deinterleaver modules. Interleaver/deinterleaver configuration parameters have previously been set before starting data transmission. Thus, the interleaver and deinterleaver modules are not in operation while their parameters are adjusted. However, it has been proposed that "dynamic" changes to the interleaver/deinterleaver parameters should be allowed even while these modules are in operation (that is, while data is being passed through these modules). Although interleaver/deinterleaver designs are known to those skilled in the art, previous systems have always had to reserve enough memory in advance to accommodate the maximum potential values of the interleaver/deinterleaver parameters.

Systems, apparatus, methods and techniques that constantly maintain used memory at a minimum, even during dynamic parameter changes, would represent a significant advancement in the art.

BRIEF SUMMARY

Embodiments of the present invention provide methods, techniques and apparatus for interleaving/deinterleaving that permit use of minimum memory for a given set of settings and further permit dynamic adjustment of the interleaving/deinterleaving when the depth is increased or decreased. A controller can be used to control, instruct, etc. one or more interleaving/deinterleaving devices, modules, software components, etc.

Embodiments of the present invention allow minimum-memory-implementation for use with any depth and period in DSL interleaving/deinterleaving, always allowing the minimum amount of memory to be used in both transmitter and receiver without loss of performance or of basic triangular structure, even if the interleaver/deinterleaver parameters change dynamically. Other embodiments of the present invention utilize the same general methods and/or structures but do not require implementation using the minimum memory. In the present invention, a novel cell-scheduling process ensures availability of the minimum amount of memory (or any other desired memory usage) to implement an image of the perfect triangle and works for any co-prime depth and interleaver period.

Minimal memory use may be further characterized by a simple off-line method that determines an addressing order for each of the memory cells in a minimum-memory (or other) implementation of an interleaver/deinterleaver according to the invention. Time variation of interleaver depth in operation can be accommodated easily with absolute minimum memory requirement at all time instants.

Further details and advantages of the invention are provided in the following Detailed Description and the associated Figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1:
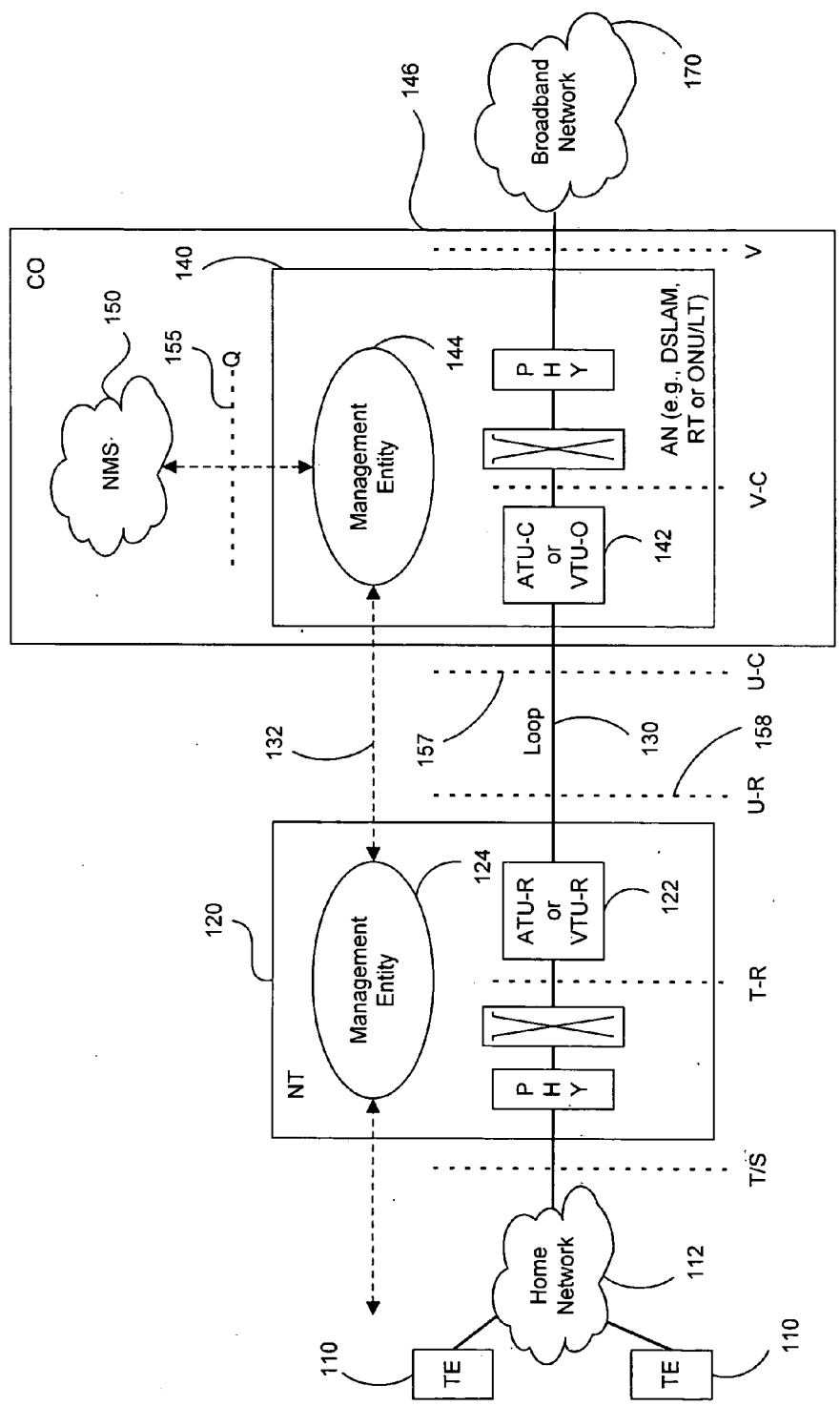
FIG. 1 is a schematic block reference model system per the G.997.1 standard applicable to ADSL, VDSL and other communication systems in which embodiments of the present invention may be used.

The following detailed description of the invention will refer to one or more embodiments of the invention, but is not limited to such embodiments. Rather, the detailed description is intended only to be illustrative. Those skilled in the art will readily appreciate that the detailed description given herein with respect to the Figures is provided for explanatory purposes as the invention extends beyond these limited embodiments.

Inventions according to the present invention include apparatus, methods and computer program products. The communications systems in which embodiments of the present invention may be used may include ADSL, VDSL and/or or any other communications system and/or lines with which the present invention is practical, as will be appreciated by those skilled in the art after reading the present disclosure. For purposes of explanation and illustration, DSL systems are used herein, but the invention is not so limited.

In one embodiment of the present invention, a method of performing convolutional interleaving of a data flow uses a depth D and a period I. The method begins by determining a schedule for each of R memory cells and then performing for each time sample a series of operations. A first memory cell is selected from the R memory cells based on the schedules of the R memory cells. A first byte is read and stored in the first memory cell and is later written to the interleaver output. A second byte is received at the input of the interleaver and later written to the first memory cell. The schedule for each of the R memory cells can be generated by constructing an array having a plurality of rows, wherein each row of the array has a first element defining a period index P and a second element defining a byte index B. The arrays can be constructed by generating a first row of the array using initialization values for P and B and then constructing one or more additional rows. This can be done in a variety of ways using D, I, P, B and a position index L. Selecting a first memory cell from the R memory cells can be done in different ways, for example by examining the schedules of the R memory cells to identify the memory cell whose schedule includes a current time sample or, in another example, by reading a scheduling table that has rows corresponding to period indices and columns corresponding to byte indices, where the contents of the table consist of pointers to memory cells for period indices and byte indices corresponding to time samples. Where minimum memory is sought to be used, $$R = \frac{(D-1)\cdot(I-1)}{2}.$$

A method for dynamically changing the depth for convolutionally interleaving a data flow begins with determining a first schedule set for R memory cells using a depth D and an interleaving period I, where R is based on D and I. Read and write operations are performed on the R memory cells using a first schedule set (for example, "Schedule A"). A second schedule set (for example, "Schedule B") is generated using a new depth D' and a new R' based on D' and I. The method then switches to read and write operations on the R' memory cells using the second schedule set. When D' is greater than D, switching to read and write operations on the R' memory cells using the second schedule set allows transferring from the first schedule set to the second schedule set immediately. When D' is smaller than D, then switching to read and write operations on the R' memory cells using the second schedule set transfers from the first schedule set to the second schedule set using a transition period during which no interleaver write operations are performed. Interleaver read operations continue before the end of the transition period using an interleaver output byte delay that corresponds to a depth equal to D. Finally, interleaver read operations continue after the end of the transition period using an interleaver output byte delay corresponding to a depth equal to D'. As with the interleaving/deinterleaving method above, schedules are constructed in various ways. Again, where minimum memory implementation is desired, $$R = \frac{(D-1)\cdot(I-1)}{2} \text{ and } R' = \frac{(D'-1)\cdot(I-1)}{2}.$$

A minimum-memory-capable interleaver/deinterleaver uses period I and first depth D. The interleaver/deinterleaver has an input configured to provide consecutive data bytes for interleaving/deinterleaving and an output configured to deliver consecutive data bytes after interleaving/deinterleaving. The interleaver/deinterleaver also uses R memory cells, each of which is coupled between the input and the output. A controller controls the memory cells so that, at a given time sample, a first data byte is written from a first memory cell to the output and a second data byte is read to a second memory cell from the input. Moreover, controller operation is based on schedules determined for each of the R memory cells. The interleaver/deinterleaver can be configured to operate consistent with the methods described above, including a minimum memory implementation where R memory cells are used and $$R = \frac{(D-1)\cdot(I-1)}{2}.$$

As described in more detail below, implementation of one or more interleavers and/or deinterleavers using one or more embodiments of the present invention can be part of a communication device (for example, a transmitter, receiver, modem, transceiver, controller, DSL optimizer, DSLAM, LT device, RT device, DSL modem and the like). Such implementation may be controlled and/or assisted by an interleaving/deinterleaving control unit in a local device (again, for example, a DSLAM, LT device, modem, etc.) and/or in a remote device, such as a controller (for example, in or as a DSL optimizer, dynamic spectrum manager or spectrum management center). The term "interleaver/deinterleaver" and the like in this disclosure and the claims refer to either an interleaver, a deinterleaver or both as a pair of cooperative devices, as will be appreciated by those skilled in the art.

The control unit for interleaving/deinterleaving can be located anywhere. In some embodiments, a controller having an interleaving/deinterleaving control unit resides in a DSL CO, while in other cases it may be operated by a third party located outside the CO. The structure, programming and other specific features of a controller and/or control unit usable for interleaving/deinterleaving in connection with embodiments of the present invention will be apparent to those skilled in the art after reviewing the present disclosure.

A controller, such as a DSL optimizer, dynamic-spectrum-management center (DSM Center), a "smart" modem and/or computer system can be used to collect and analyze the operational data and/or performance parameter values as described in connection with the various embodiments of the present invention. The controller and/or other components can be a computer-implemented device or combination of devices. In some embodiments, the controller is in a location remote from modems or other communication equipment coupled to a communication line. In other cases, the controller may be collocated with one of or both of the "local" devices (that is, devices directly coupled to a communication line or part of such a local device) as equipment directly connected to a modem, DSLAM or other communication system device, thus creating a "smart" modem. The phrases "coupled to" and "connected to" and the like are used herein to describe a connection between two elements and/or components and are intended to mean coupled either directly together, or indirectly, for example via one or more intervening elements or via a wireless connection, where appropriate.

Some of the following examples of embodiments of the present invention will be used in connection with DSL as exemplary communications systems. Within these DSL systems, certain conventions, rules, protocols, etc. may be used to describe operation of the exemplary DSL system and the information and/or data available from customers (also referred to as "users") and/or equipment on the system. However, as will be appreciated by those skilled in the art, embodiments of the present invention may be applied to various communications systems, and the invention is not limited to any particular system.

Various network-management elements are used for management of DSL physical-layer resources, where elements refer to parameters or functions within a DSL modem pair, either collectively or at an individual end. A network-management framework consists of one or more managed nodes, each containing an agent. The managed node could be a router, bridge, switch, modem or other. At least one NMS (Network Management System), which is often called the manager, monitors and controls managed nodes and is usually based on a common PC or other computer. NMS is in some instances also referred to as an Element Management System (EMS). A network management protocol is used by the manager and agents to exchange management information and data. The unit of management information is an object. A collection of related objects is defined as a Management Information Base (MIB).

FIG. 1 shows the reference model system according to the G.997.1 standard (G.ploam), which applies to various ADSL and VDSL systems, which is well known to those skilled in the art, and in which embodiments of the present invention can be implemented. This model applies to ADSL and VDSL systems meeting the various standards that may or may not include splitters, such as ADSL1 (G.992.1), ADSL-Lite (G.992.2), ADSL2 (G.992.3), ADSL2-Lite (G.992.4), ADSL2+ (G.992.5), VDSL1 (G.993.1) and other G.993.x emerging VDSL standards, as well as the G.991.1 and G.991.2 SHDSL standards, all with and without bonding. These standards, variations thereto, and their use in connection with the G.997.1 standard are all well known to those skilled in the art.

The G.997.1 standard specifies the physical layer management for ADSL and VDSL transmission systems based on the clear embedded operation channel (EOC) defined in G.997.1 and use of indicator bits and EOC messages defined in G.99x standards. Moreover, G.997.1 specifies network management elements content for configuration, fault and performance management. In performing these functions, the system utilizes a variety of operational data that are available at and can be collected from an access node (AN). The DSL Forum's TR69 report also lists the MIB and how it might be accessed. In FIG. 1, customers' terminal equipment 110 is coupled to a home network 112, which in turn is coupled to a network termination unit (NT) 120. In the case of an ADSL system, NT 120 includes an ATU-R 122 (for example, a modem, also referred to as a transceiver in some cases, defined by one of the ADSL and/or VDSL standards) or any other suitable network termination modem, transceiver or other communication unit. The remote device in a VDSL system would be a VTU-R. As will be appreciated by those skilled in the art and as described herein, each modem interacts with the communication system to which it is connected and may generate operational data as a result of the modem's performance in the communication system.

NT 120 also includes a management entity (ME) 124. ME 124 can be any suitable hardware device, such as a microprocessor, microcontroller, or circuit state machine in firmware or hardware, capable of performing as required by any applicable standards and/or other criteria. ME 124 collects and stores performance data in its MIB, which is a database of information maintained by each ME, and which can be accessed via network management protocols such as SNMP (Simple Network Management Protocol), an administration protocol used to gather information from a network device to provide to an administrator console/program or via TL1 commands, TL1 being a long-established command language used to program responses and commands between telecommunication network elements.

Each ATU-R in a system is coupled to an ATU-C in a CO or other upstream and/or central location. In a VDSL system, each VTU-R in a system is coupled to a VTU-O in a CO or other upstream and/or central location (for example, any line termination device such as an ONU/LT, DSLAM, RT, etc.). In FIG. 1, ATU-C 142 is located at an access node (AN) 140 in a CO 146. AN 140 may be a DSL system component, such as a DSLAM, ONU/LT, RT or the like, as will be appreciated by those skilled in the art. An ME 144 likewise maintains an MIB of performance data pertaining to ATU-C 142. The AN 140 may be coupled to a broadband network 170 or other network, as will be appreciated by those skilled in the art. ATU-R 122 and ATU-C 142 are coupled together by a loop 130, which in the case of ADSL (and VDSL) typically is a telephone twisted pair that also carries other communication services. In a bonded system, such as those described in U.S. Ser. No. 10/808,771, which is incorporated herein by reference for all purposes, multiple loops 130 can be "bonded" to operate together for a single user, thus providing additional bandwidth to that user. As will be appreciated by those skilled in the art, a bonded line set also provides the opportunity for improved cancellation of crosstalk that is induced between the bonded lines. Use of this characteristic and the joint optimization of the lines' transmitters in connection with the present invention is explained in more detail below.

Several of the interfaces shown in FIG. 1 can be used for determining and collecting operational and/or performance data. To the extent the interfaces in FIG. 1 differ from another ADSL and/or VDSL system interface scheme, the systems are well known and the differences are known and apparent to those skilled in the art. The Q-interface 155 provides the interface between the NMS 150 of the operator and ME 144 in AN 140. All the parameters specified in the G.997.1 standard apply at the Q-interface 155. The near-end parameters supported in ME 144 are derived from ATU-C 142, while the far-end parameters from ATU-R 122 can be derived by either of two interfaces over the U-interface. Indicator bits and EOC messages, which are sent using embedded channel 132 and are provided at the PMD layer, can be used to generate the required ATU-R 122 parameters in ME 144. Alternately, the OAM (Operations, Administrations and Management) channel and a suitable protocol can be used to retrieve the parameters from ATU-R 122 when requested by ME 144. Similarly, the far-end parameters from ATU-C 142 can be derived by either of two interfaces over the U-interface. Indicator bits and EOC messages, which are provided at the PMD layer, can be used to generate the required ATU-C 142 parameters in ME 124 of NT 120. Alternately, the OAM channel and a suitable protocol can be used to retrieve the parameters from ATU-C 142 when requested by ME 124.

At the U-interface (which is essentially loop 130), there are two management interfaces, one at ATU-C 142 (the U-C interface 157) and one at ATU-R 122 (the U-R interface 158). Interface 157 provides ATU-C near-end parameters for ATU-R 122 to retrieve over the U-interface 130. Similarly, interface 158 provides ATU-R near-end parameters for ATU-C 142 to retrieve over the U-interface 130. The parameters that apply may be dependent upon the transceiver standard being used (for example, G.992.1 or G.992.2).

The G.997.1 standard specifies an optional OAM communication channel across the U-interface. If this channel is implemented, ATU-C and ATU-R pairs may use it for transporting physical layer OAM messages. Thus, the transceivers 122, 142 of such a system share various operational and performance data maintained in their respective MIBs.

More information can be found regarding ADSL NMSs in DSL Forum Technical Report TR-005, entitled "ADSL Network Element Management" from the ADSL Forum, dated March 1998. Also, DSL Forum Technical Report TR-069, entitled "CPE WAN Management Protocol," dated May 2004. Finally, DSL Forum Technical Report TR-064, entitled "LAN-Side DSL CPE Configuration Specification" from the DSL Forum, dated May 2004. These documents address different situations for CPE side management and the information therein is well known to those skilled in the art. More information about VDSL can be found in the ITU standard G.993.1 (sometimes called "VDSL1") and the emerging ITU standard G.993.2 (sometimes called "VDSL2"), as well as several DSL Forum working texts in progress, all of which are known to those skilled in the art. For example, additional information is available in the DSL Forum's Technical Report TR-057 (Formerly WT-068v5), entitled "VDSL Network Element Management" (February 2003) and Technical Report TR-065, entitled "FS-VDSL EMS to NMS Interface Functional Requirements" (March 2004) as well as in the emerging revision of ITU standard G.997.1 for VDSL1 and VDSL2 MIB elements, or in the ATIS North American Draft Dynamic Spectrum Management Report, NIPP-NAI-2005-031.

It is less common for lines sharing the same binder to terminate on the same line card in ADSL, than it is in VDSL. However, the following discussion of DSL systems may be extended to ADSL because common termination of same-binder lines might also be done (especially in a newer DSLAM that handles both ADSL and VDSL). In a typical topology of a DSL plant, in which a number of transceiver pairs are operating and/or available, part of each subscriber loop is collocated with the loops of other users within a multi-pair binder (or bundle). After the pedestal, very close to the Customer Premises Equipment (CPE), the loop takes the form of a drop wire and exits the bundle. Therefore, the subscriber loop traverses two different environments. Part of the loop may be located inside a binder, where the loop is sometimes shielded from external electromagnetic interference, but is subject to crosstalk. After the pedestal, the drop wire is often unaffected by crosstalk when this pair is far from other pairs for most of the drop, but transmission can also be more significantly impaired by electromagnetic interference because the drop wires are unshielded. Many drops have 2 to 8 twisted-pairs within them and in situations of multiple services to a home or bonding (multiplexing and demultiplexing of a single service) of those lines, additional substantial crosstalk can occur between these lines in the drop segment.

Figure 2A:
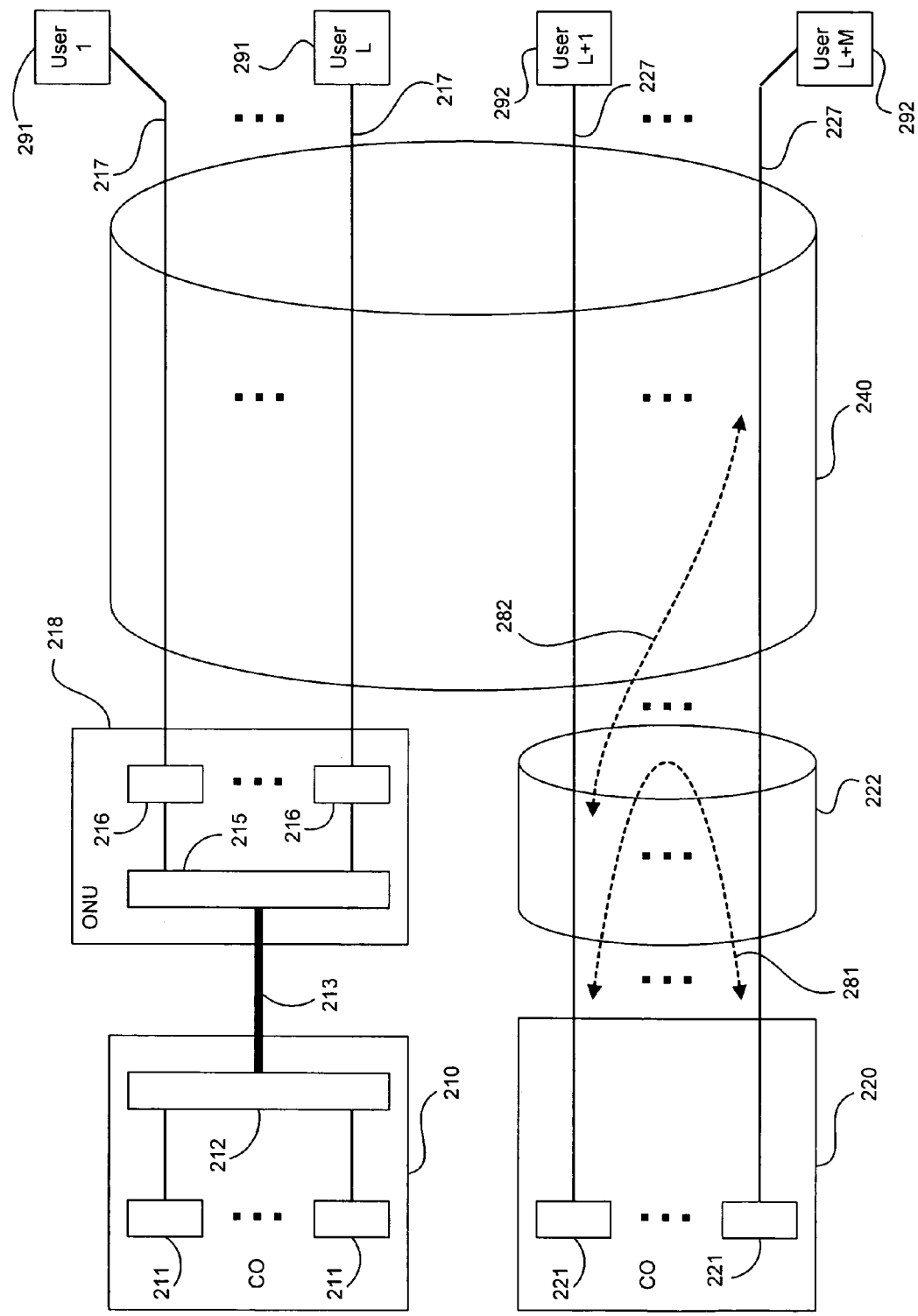
FIG. 2A is a schematic diagram illustrating generic, exemplary DSL deployment.

A generic, exemplary DSL deployment scenario is shown in FIG. 2A. All the subscriber loops of a total of (L+M) users 291, 292 pass through at least one common binder. Each user is connected to a Central Office (CO) 210, 220 through a dedicated line. However, each subscriber loop may be passing through different environments and mediums. In FIG. 2A, L customers or users 291 are connected to CO 210 using a combination of optical fiber 213 and twisted copper pairs 217, which is commonly referred to as Fiber to the Cabinet (FTT-Cab) or Fiber to the Curb. Signals from transceivers 211 in CO 210 have their signals converted by optical line terminal 212 and optical network terminal 215 in CO 210 and optical network unit (ONU) 218. Modems 216 in ONU 218 act as transceivers for signals between the ONU 218 and users 291.

Users' lines that co-terminate in locations such as COs 210, 218 and ONU 220 (as well as others) may be operated in a coordinated fashion, such as vectoring. In vectored communication systems (such as vectored ADSL and/or VDSL systems), coordination of signals and processing can be achieved. Downstream vectoring occurs when multiple lines' transmit signals from a DSLAM or LT are co-generated with a common clock and processor. In VDSL systems with such a common clock, the crosstalk between users occurs separately for each tone. Thus each of the downstream tones for many users can be independently generated by a common vector transmitter. Similarly, upstream vectoring occurs when a common clock and processor are used to co-receive multiple lines' signals. In VDSL systems with such a common clock, the crosstalk between users occurs separately for each tone. Thus each of the upstream tones for many users can be independently processed by a common vector receiver.

The loops 227 of the remaining M users 292 are copper twisted pairs only, a scenario referred to as Fiber to the Exchange (FTTEx). Whenever possible and economically feasible, FTTCab is preferable to FTTEx, since this reduces the length of the copper part of the subscriber loop, and consequently increases the achievable rates. Moreover, FTT-Cab is expected to become an increasingly popular topology. This type of topology can lead to substantial crosstalk interference and may mean that the lines of the various users have different data carrying and performance capabilities due to the specific environment in which they operate. The topology can be such that fiber-fed "cabinet" lines and exchange lines can be mixed in the same binder. The crosstalk noises created by lines terminating at different places usually cannot be canceled directly by well-known decision-feedback mechanisms and instead represent time-varying spatial noises that can be completely or partially canceled by the invention described herein.

As can be seen in FIG. 2A, the lines from CO 220 to users 292 share binder 222, which is not used by the lines between CO 210 and users 291. Moreover, another binder 240 is common to all the lines to/from CO 210 and CO 220 and their respective users 291, 292. In FIG. 2A, far end crosstalk (FEXT) 282 and near end crosstalk (NEXT) 281 are illustrated as affecting at least two of the lines 227 collocated at CO 220.

As will be appreciated by those skilled in the art, at least some of the operational data and/or parameters described in these documents can be used in connection with embodiments of the present invention. Moreover, at least some of the system descriptions are likewise applicable to embodiments of the present invention. Various types of operational data and/or information available from a DSL NMS can be found therein; others may be known to those skilled in the art.

Figure 2B:
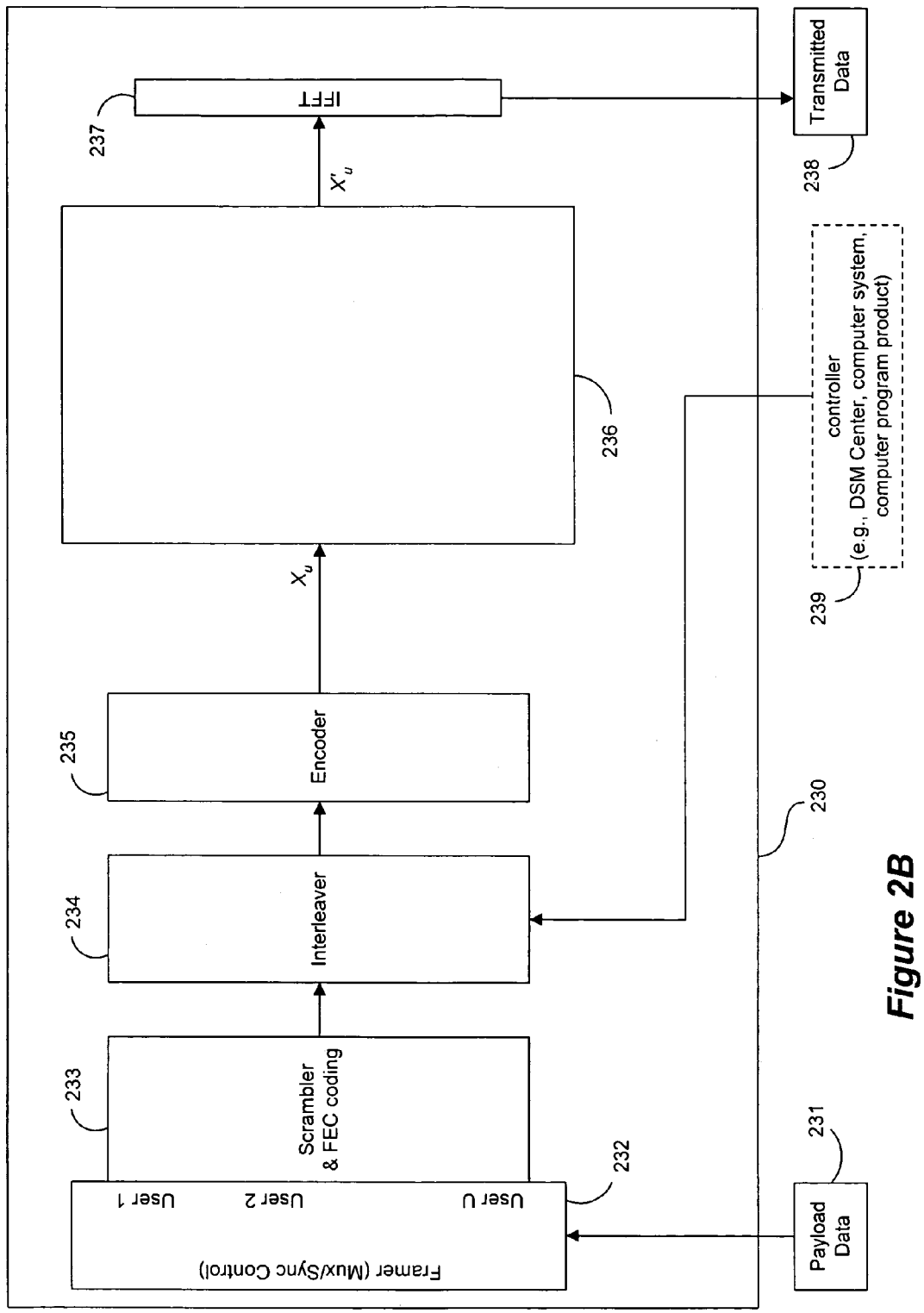
FIG. 2B is a schematic diagram of a transmitter in which embodiments of the present invention can be implemented in a system such as the generic, exemplary DSL deployment of FIG. 2A.

FIG. 2B illustrates one embodiment of the present invention in the context of a DSL transmitter 230 (for example, the type found in a DSLAM or other upstream-end device). Payload data 231 of U lines is provided to a framer 232, which can include scrambling and FEC coding 233 for the U lines, then interleaving 234 and encoding 235, as well as other processing 236 (for example, precoding of some sort), as will be appreciated by those skilled in the art. Data may be sent to an interleaver 234 implementing an embodiment of the present invention as described herein. As will be appreciated by those skilled in the art, an upstream transmitter from a single user can implement this same general scheme, except that only a single DSL line or a bonded line set would be used to transmit data to an upstream-end device. The same processing, including interleaving, would be implemented in such a CPE device.

The data from processing 236 may then consequently be sent to an inverse fast Fourier transform (IFFT) unit 237 prior to transmission at 238. As will be appreciated by those skilled in the art, other transmitter configurations can be used to implement interleaving according to the present invention. A controller 239 may control, update, etc. the interleaver 234 and its operation in a manner consistent with the present invention.

Figure 2C:
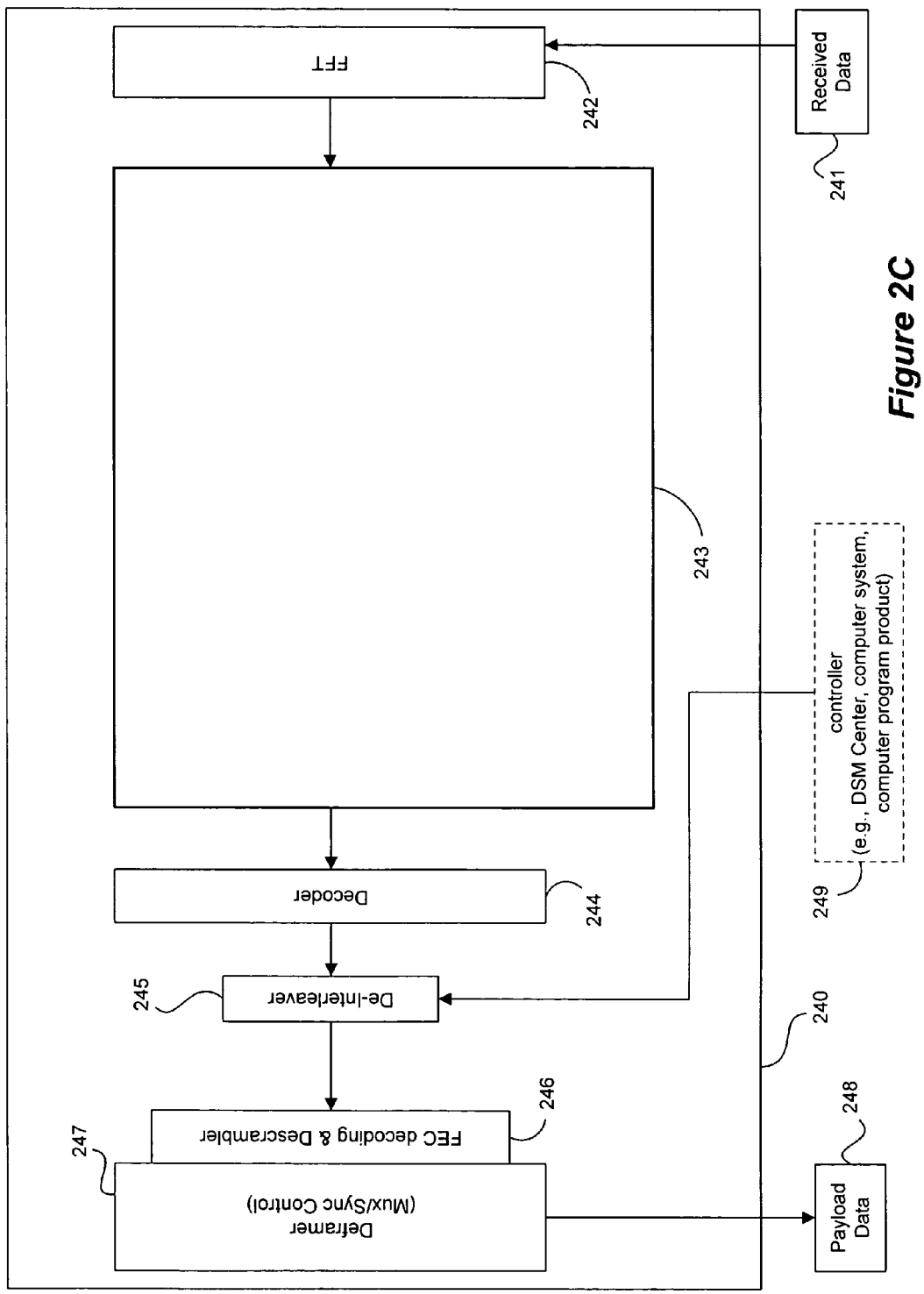
FIG. 2C is a schematic diagram of a receiver in which embodiments of the present invention can be implemented in a system such as the generic, exemplary DSL deployment of FIG. 2A.

A receiver likewise implementing one or more embodiments of the present invention is shown in FIG. 2C. The receiver 240 operates in a manner generally complementary to that of transmitter 230 in FIG. 2B. The receiver 240 of FIG. 2C is a single user receiver and those skilled in the art will readily appreciate that a multi-user receiver (such as a DSLAM or other upstream-end device) could implement the present invention in a multi-line setting as well. Received data 241 is sent to an FFT 242 and may be processed at 243 (for example, a GDFE function or the like). Thereafter, the data is decoded 244 and sent to a deinterleaver 245. After deinterleaving at 245, the data may be passed to FEC decoding and descrambling 246 and deframing 247 before payload data 248 is generated. A controller 249 may control, update, etc. the deinterleaver 245 and its operation in a manner consistent with the present invention.

Recent advances in the electronics field have now made high-speed digital data communications prevalent in many types of applications and uses. Digital communication techniques are now used for communication of various signals, including DSL systems. The quality of communications carried out in these ways depends upon the accuracy with which the received signals match the transmitted signals. Some types of communications, such as audio communication, can withstand bit loss to a relatively large degree. However, the communication of digital data often requires exact fidelity in order to be at all useful. Accordingly, various techniques for the detection and correction of errors in communicated digital bit streams have been developed. Indeed, error correction techniques have effectively enabled digital communication signals to be carried over available communication facilities, such as existing telephone lines, despite the error rates inherent in high-frequency communication over these facilities.

An important class of error-detection and error-correction techniques is referred to as Reed-Solomon (RS) coding, which is well known to those skilled in the art. RS encoding is used to generate an encoded message in such a manner that, upon decoding of the received encoded message, the number and location of any errors in the received message may be determined. RS decoding is especially beneficial in the detection and correction of random errors in a communicated bitstream. However, the limitation in the number of errors that may be corrected by RS techniques precludes the correction of errors of a type referred to as "burst errors" or impulse noise in the art.

Convolutional interleaving is a conventional technique used to overcome this limitation of RS coding. In a general sense, convolutional interleaving operates by scrambling the time sequence of the transmitted bitstream from that of the conventional first-in-first-out sequence. At the receiving end, the received bitstream is then descrambled, or resequenced, to recover the transmitted message or data. Because of the scrambled sequence of the transmitted data, errors occurring within the scrambled bitstream over the communications facility are dispersed over time. This reduces the density of the error in the actual transmitted message, permitting correction of the errors by subsequent RS (or other) decoding. In general, convolutional interleaving introduces varying delay between adjacent codewords in a sequence, such that the temporal sequence of codewords, as transmitted, differs from the message sequence; an inversely varying delay is then introduced between received adjacent codewords, to restore the sequence.

Embodiments of the present invention provide minimum-memory-implementation for use with any depth and period in DSL interleaving, always allowing the minimum amount of memory to be used in both transmitter and receiver without loss of performance or of the basic triangular structure, even if the interleaver parameters change dynamically. Other embodiments of the present invention utilize the same general methods and/or structures but do not require implementation using the minimum memory. In the present invention, a novel cell-scheduling process ensures use of the minimum amount of memory to implement an image of the perfect triangle and works for any co-prime depth and interleaver period. In the foregoing description of embodiments of the invention, most of the description is given in terms of an interleaver. However, as will be appreciated by those skilled in the art, the description of an interleaver is adequate for the purposes of understanding the corresponding functions of a deinterleaver. Furthermore, a basic outline of the correspondence is given below.

Minimal memory use is further characterized by a simple off-line method that determines an addressing order for each of the memory cells in a minimum-memory implementation of the interleaver. Time variation of interleaver depth in operation can be accommodated easily with absolute minimum memory requirement at all time instants, unlike time-variable interleavers of earlier systems, which had to allocate enough memory in advance to account for the worst-case (maximum) memory needed at some time instant.

As noted above, DSL interleaving generally reorders transmitted symbols, which are bytes from the perspective of the interleaver in all DSLs. As used herein, the term "byte" will refer to any convenient data packet and/or data packet size of any number of bits used in interleaving and/or deinterleaving.

The deinterleaver inverts the reordering to the original order of the bytes. Interleavers typically are characterized by a depth D and a period I. The period of the interleaver often is the codeword length or some other convenient packet size (the period is often erroneously called the "codeword length," but in general the period need not have a relationship with codeword length, just as a convolutional code may not have a finite codeword length). The period of the interleaver typically has been defined as the time period (in byte intervals) over which the reordering algorithm or process repeats itself. The depth is the smallest separation between two adjacent input symbols after re-ordering.

A burst of errors can be corrected by a system using RS coding and interleaving when the following conditions are satisfied:

The error burst length must be less than the interleaver depth (D) times the number of correctable bytes of the RS code; and The burst of errors must be separated from any other burst of errors by more than the interleaver depth times the interleaver period (D*I).

The power of DSL's forward-error-correcting (FEC) code is magnified by the depth in this situation, essentially for large depths making the system more resilient to impulse noise. All DSLs use a special and very practical form of interleaving, which in ADSL is often called a "convolutional interleaver," but is in fact constrained by having a period equal to the codeword length. Thus, it is a special case of more general convolutional interleaving and can be implemented by a structure similar to VDSL's "triangular interleaver."

Notation used herein may not be conventional and may differ from the notation often used in textbooks, research papers and other works in the field of interleaving, in particular with respect to the well-known results of Forney. The essential difference is that embodiments of the present invention may be described as DSL interleavers in terms of an I×I generator matrix $G(D_{sym})$. The notational difference specifically here is that the delay element (a register or byte of RAM in DSL) is denoted in terms of the symbol (byte) clock and is denoted $D_{sym}$ and represents a delay of one byte period. Previously, interleavers have used a variable that represents this delay in terms of interleaver periods, call it $D_{period}$, where $D_{period} = D_{sym}^I$, where a delay of one period is equal to I symbol periods of delay. Time 0 will be referenced in this approach as the first byte time of the first interleaver period of operation, or any other convenient start of a period of the interleaver in subsequent operation. The input/output relationship of the interleaver in the notation used herein is $$\underbrace{u'(D_{sym})}_{1 \times I\, output} = \underbrace{u(D_{sym})}_{1 \times I\, Input} \cdot \underbrace{G(D_{sym})}_{I \times I\, Generator} \qquad \text{Equation (1)}$$

The entries in the input and output are "D" transforms that symbolically form for each of the I positions in the input vector $u(D_{sym})$, or in the output vector $u'(D_{sym})$, the $$\text{sum } u_i(D_{sym}) = \sum_{k=0}^{\infty} u_{k,i} \cdot D_{sym}^k,$$

$$i = 0, \ldots, I-1$$

where k is a symbol-time index. The addition (which is never executed and is purely symbolic in this case) can be considered mod-256 and powers of $D_{sym}$ are multiplied by adding exponents. In the generator matrix $G(D_{sym})$, each row and column has one and only one non-zero element that is either 1 or $D_{sym}^k$. Such a matrix reorders the inputs uniquely and is invertible. The inverse characterizes the deinterleaver.

The triangular interleaver is described in DSL standards as delaying byte i of the period (i=0, ..., I−1) by (D−1)·i further byte periods. The deinterleaver then delays by any remaining amount to make the total delay for all bytes equal to (D−1)·(I−1) byte periods. It is obvious that the minimum number of memory locations is necessarily the full system delay (D−1)·(I−1) bytes. This memory is also half in the transmitter and half in the receiver.

DSL's triangular interleavers all have the diagonal form (time 0 is the leftmost entry in the vector in this form):

$$G(D_{sys}) = \begin{bmatrix} 1 & 0 & 0 & 0 \\ 0 & D_{sym}^D & 0 & 0 \\ 0 & 0 & \ddots & 0 \\ 0 & 0 & 0 & D_{sym}^{D \cdot (I-1)} \end{bmatrix} \qquad \text{Eq. (2)}$$

The generator in this disclosure's notation shows that the positional delay of i bytes relative to the start of the period plus the further delay of an additional i·(D−1) bytes generates a total time delay of i·D byte periods with respect to the beginning of a period. There is no restriction on D in this written expression of the triangular interleaver. Some earlier systems have usually assumed an isosceles-triangular implementation only when the depth is restricted to D=I+1. However, the present invention illustrates that this restriction is not necessary for perfect isosceles implementation, as explained herein.

There is a restriction that D and I are co-prime for any interleaver. ADSL handles any D and I with common factors by inserting dummy bytes (that are not transmitted) at the transmitter, thus increasing I to its next largest value that is co-prime with D. Corresponding dummy bytes can again be inserted in the appropriate positions by the receiver without any need to transmit these bytes over the channel and thus without the consequent bandwidth loss. VDSL1 (G.993.1) only allows choices for positive integers M of interleaving depth that satisfy D=M·I+1 and forces D, I to be co-prime (this disclosure sets M=1 initially and returns to larger values of M later). VDSL2 (G.993.2) allows any choice of D and I such that D and I are co-prime.

Figure 3:
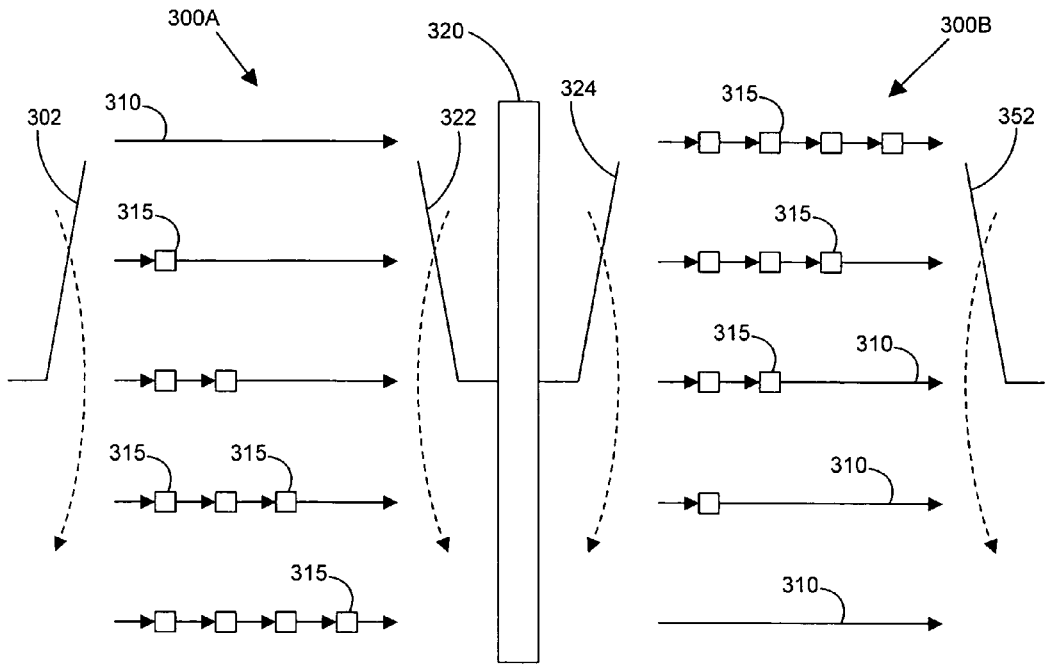
FIG. 3 is a triangular DSL interleaver/deinterleaver pair.

FIG. 3 illustrates a basic triangular interleaver 300A and deinterleaver 300B with depth of D=I+1=6. The input bytes are applied successively by an input commutator 302 over each period of 5 bytes to the 5 lines 310 of the interleaver 300A. The first byte in each period passes immediately to the channel 320 via output commutator 322, the second byte is delayed 5 bytes (which is one period in this case) by delay element 315 before entering the channel with respect to its time of entry (which is 6 byte periods after the beginning of the period in which that byte occurred), and so on. The triangular array of registers or memory cells is obvious, and so is the corresponding deinterleaver structure 300B to restore the bytes to their original order. The total delay is DELAY=(D−1)·(I−1)=20 byte periods, and the memory requirement is 10 cells in each of the interleaver and the deinterleaver. This structure has previously been called "triangular." In the structure of FIG. 3, each delay element 315 could instead be clocked at the interleaver period, so that delays could be shown as just single-period delays instead of representing them as groups of I=5 byte delays. Forney circumvents this event of re-labeling I byte delays as a single symbol delay, but this alternative nomenclature leads to a complicated modulo arithmetic system that is a result of period-level-timing and not symbol-level-timing. The alternative notation used in connection with the present invention provides a better understanding of prior non-isosceles near-triangular implementations.

Figure 4:
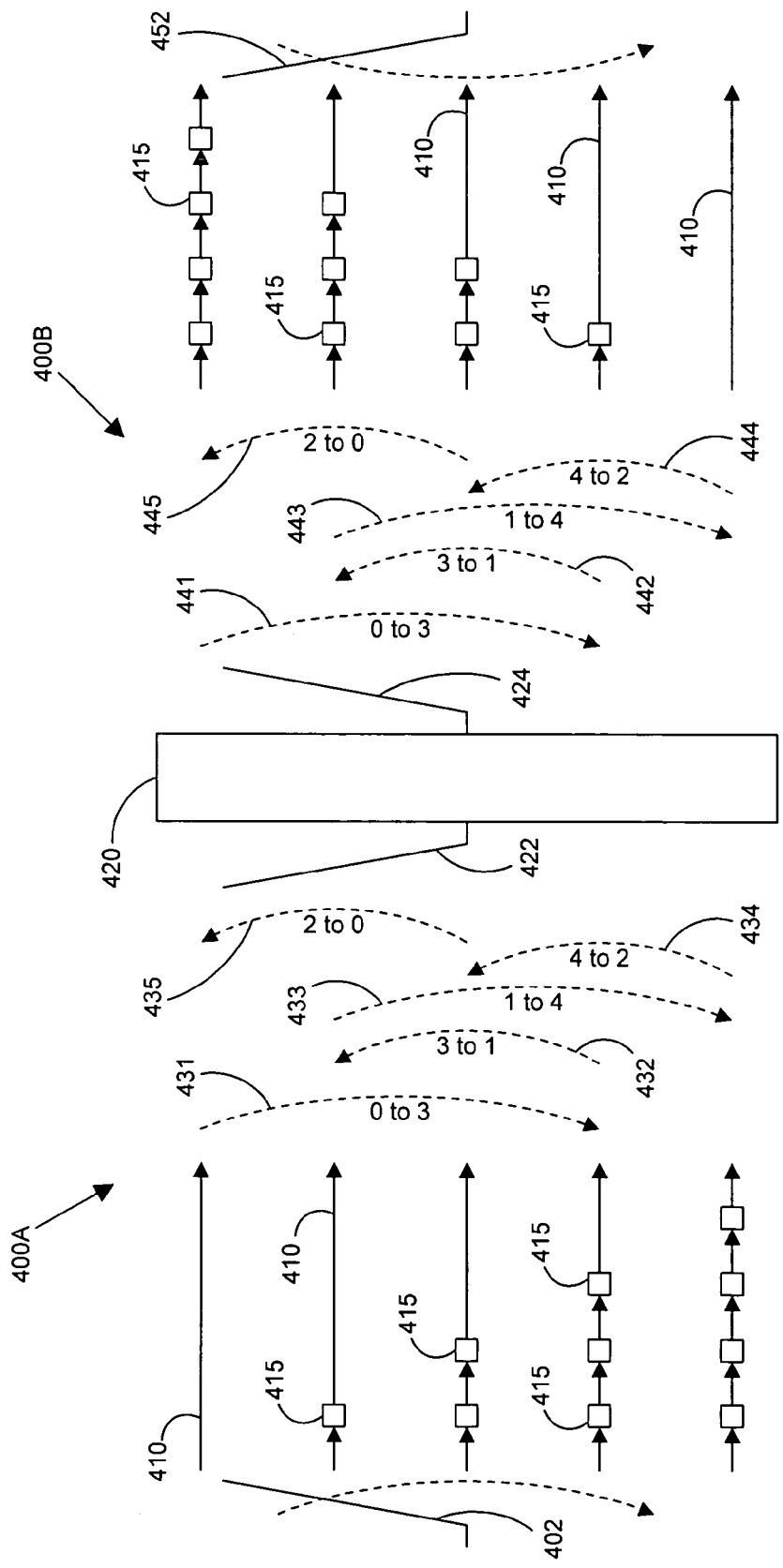
FIG. 4 is a DSL interleaver/deinterleaver configuration implementing one or more embodiments of the present invention.

FIG. 4 illustrates a situation where the depth is less than I+1, and is in fact equal to 2, so that period I=5 and depth D=2. In FIG. 4, the output commutator 422 of the interleaver 400A does not move sequentially from one line 410 to the next. Instead, a time-slot interchange is used to move from line 0 to line 3 at 431, line 3 to line 1 at 432, line 1 to line 4 at 433, line 4 to line 2 at 434, and finally line 2 to line 0, before beginning the sequence again. Each delay element 415 is $D_{sym}^{D-1}$ rather than $D_{sym}^{I}$. The deinterleaver 400B operates in an analogous fashion, as will be appreciated by those skilled in the art.

Figure 5:
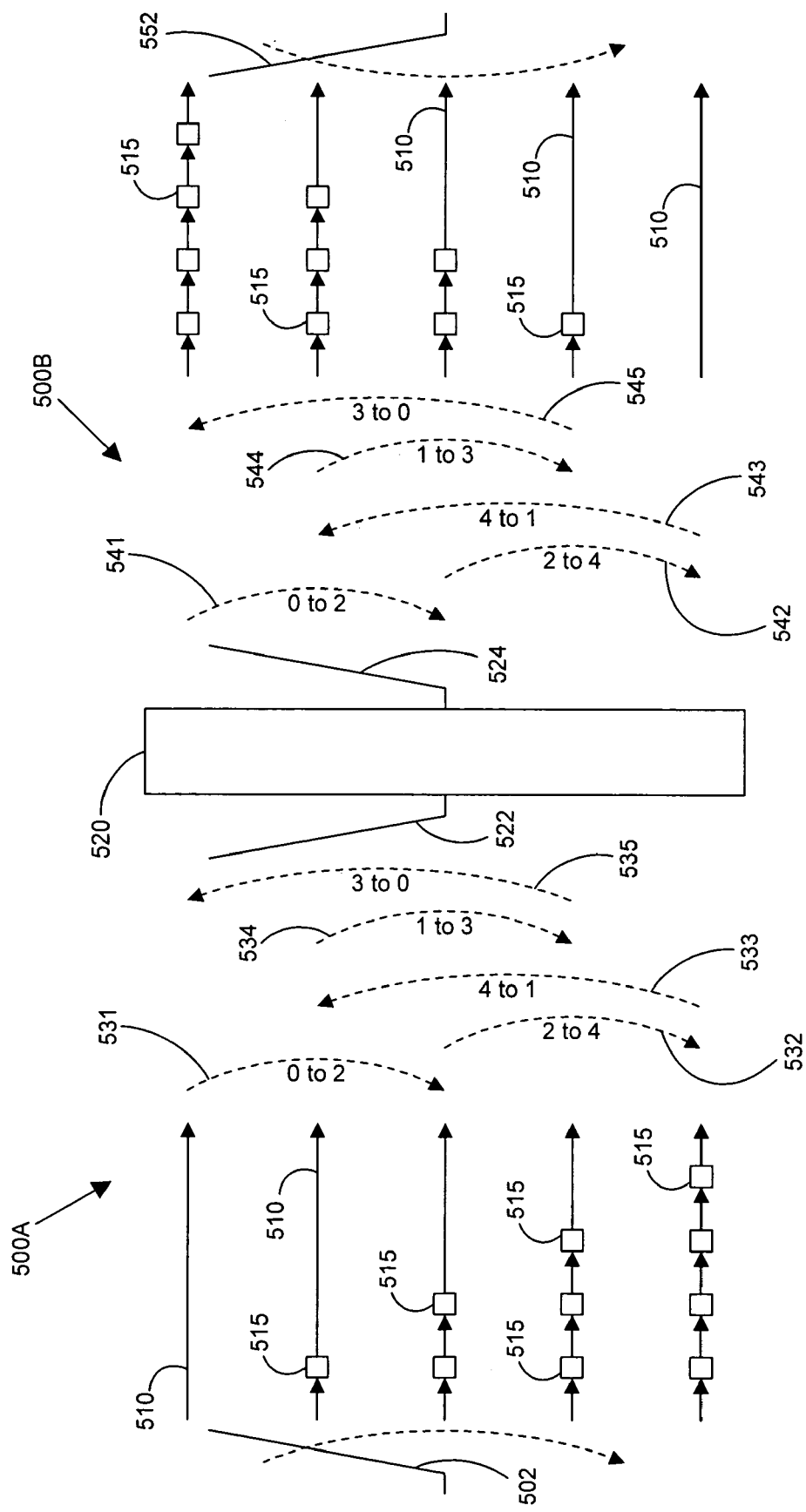
FIG. 5 is a DSL interleaver/deinterleaver configuration implementing one or more embodiments of the present invention.

Similarly, FIG. 5 illustrates period I=5 and depth D=3. The sequence followed by input commutator 522 of the interleaver 500A of FIG. 5 is line 0 to line 2 at 531, line 2 to line 4 at 532, line 4 to line 1 at 533, line 1 to line 3 at 534, line 3 to line 0 at 535, and then repeats. Again, as will be appreciated by those skilled in the art, the deinterleaver 500B operates in an analogous manner.

The differences between FIGS. 3, 4 and 5 are slight and have to do with the position and transitioning of the commutator, the new time-slot interchange added to the input and the output of the channel (that is at the output of the interleaver and the input of the deinterleaver, respectively). Instead of a uniform switching to consecutive lines by the interleaver output and deinterleaver input, the interleaver output and deinterleaver input in embodiments of the present invention selectively move at times by more than one line to receive the next output of the interleaver and to input values to the deinterleaver. According to the present invention, if D and I are co-prime, then the order can be determined for any situation, examples of which are illustrated in FIGS. 4 and 5.

The interleaver-input at time k within a period corresponds to an interleaver-output position of i(k) or just i. The interleaver may only write into line i if the data already in that line is leaving (to avoid losing the stored value). Considering the output position as a "read-line" index, then the total delay in line i with respect to the start of the interleaver position is (D−1)·i+i=D·i, as in the notation generator matrix of Equation (2) for that position. This total delay, mod I, must be then equal to the input position k because the data leaves the line after exactly that many delays with respect to the start of the interleaver period. Thus, $$k=(i \cdot D)_I \qquad \text{Eq. (3)}$$

This equation can be solved in terms of an i(k) value for each period time k. If this equation is solved for time k=1 to get the solution i(1)=Δ, then for any other time the solution is $$i(k)=(k \cdot \Delta)_I \qquad \text{Eq. (4)}$$

which is proved by substituting this equation into the original equation and seeing that it does solve for all i, k. The solution for D=2 is Δ=3 and so the consecutive commutator positions on the interleaver output 422 are then 0, 3, 1, 4, 2 as in FIG. 4. The solution for D=3 is Δ=2 and so the order is 0, 2, 4, 1, 3 as in FIG. 5.

As long as D and I are co-prime, the full depth is achieved and any two originally adjacent bytes are separated by at least D bytes in the channel. When D and I are not co-prime, one or more dummy bytes are added to information blocks every period to enlarge the period until it is the smallest value co-prime with the depth. These bytes are not transmitted and the receiver knows when to insert its own dummies, which are then ignored in final decoding. This procedure works as long as D≦I+1. For larger depths, a generalized triangular interleaver can be used, as described in more detail below. Thus, for ADSL and any depth D≦I+1, this triangular structure may be used, if the extra time-slot interchange is added with the above switch order as determined uniquely for each pairing of period and depth.

For ADSL, I=N always. Since depths of up to only 64 are typically used in ADSL, and N usually exceeds 100, the co-prime condition is not always met in standardized ADSL, which uses dummy bytes to enlarge the period to the next smallest value that is co-prime with the depth (one dummy byte is sufficient in ADSL). However, the RAM in some prior systems is not the minimum possible value if D≦I+1. However, if sufficient memory already exists because the situation of D=I+1 was considered, then the memory may not be of concern. In the triangular structure, when D<I+1, then RAM can be further easily reduced to the theoretical minimum of $$\frac{(D-1)(I-1)}{2}$$

by embodiments of the present invention described in more detail below. Essentially the isosceles triangle implementing the time-slot interchange is used to derive a different structure that is projected into a minimum number of memory cells.

Figure 6:
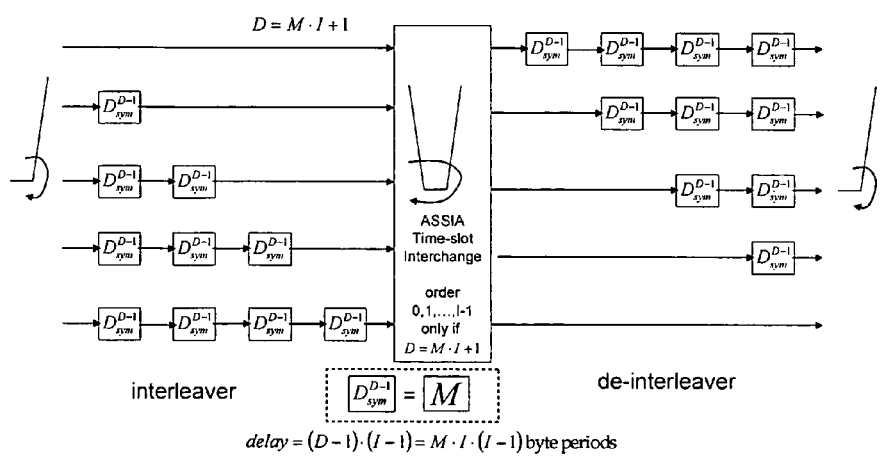
FIG. 6 is a generalized triangular DSL interleaver/deinterleaver configuration implementing one or more embodiments of the present invention.

The generalized triangular interleaver is described again as delaying byte i of the period (i=0, . . . , I−1) by (D−1)·i further byte periods. The deinterleaver then delays by any remaining amount to make the total delay for all bytes (D−1)·(I−1) byte periods. The generalized triangular interleaver allows depths that exceed the period of the interleaver, but otherwise follows exactly the same triangular rule. The general form of the interleaver is shown in FIG. 6, which is similar to the interleavers of FIGS. 3-5, with the difference being that FIG. 6 addresses the special case D=M*I+1. So, as will be appreciated by those skilled in the art, this configuration and its operation are accordingly similar to those other systems.

Again the addition of the time-slot interchange to the generalized triangular interleaver allows any co-prime depth and period to be used instead. The delays of depth-minus-one bytes still occur as usual. These are often expressed in VDSL1 standards as being equal to first-in-first-out (FIFO) registers of length M bytes each. With such an interpretation, the delay on each line again is D−1 byte periods, or D byte periods with respect to the beginning of the period corresponding to the byte. Larger M values mean larger depths. Again, any depth less than M·I+1 for any M when the depth D and period I are co-prime can be implemented within the triangular structure plus time-slot interchange that was introduced earlier with M=1. However, delay groupings are now in multiples of M bytes (instead of one byte) in this more general case with the same formula for the commutator position $$i(k)=(k \cdot \Delta)_I \qquad \text{Eq. (4)}$$

where $\Delta$ again is the solution of $1=(\Delta \cdot D)_I$. The RAM requirement for the largest depth value of $D=M \cdot I+1$ is again $$\frac{(D-1) \cdot (I-1)}{2} = \frac{1}{2} M \cdot I \cdot (I-1).$$

If the same triangular array is maintained for implementation with values of depth such that $D \leq M \cdot I+1$, the memory requirement in the triangular structure (with time-slot interchange) will be minimum. Dummy bytes can again be used when the desired D and I are not co-prime. Also, this same structure could be used in ADSL for special depths that exceed the codeword length by choosing M=2 or some larger value. Such large depths for ADSL might then exceed the available RAM in ADSL.

While structures such as the above may have appeared in some earlier systems, these previous systems failed to teach or suggest the cell-based minimum-memory invention of the present invention that is described next. Embodiments of the present invention ensure a minimum RAM requirement of $$R = \frac{(D-1) \cdot (I-1)}{2}$$

for all $D \leq M \cdot I+1$ where $M \geq 1$.

Table 1 for D = 2 and I = 5

| Line/time | 0 | 1 | 2 | 3 | 4 | 0' | 1' | 2' | 3' | 4' | 0" | 1" |
|---|---|---|---|---|---|---|---|---|---|---|---|---|
| 0 | — | — | — | — | — | — | — | — | — | — | — | — |
| 1 | — | B1 | — | — | — | — | B1' | — | — | — | — | B1" |
| 2 | — | — | B2 | B2 | — | — | — | B2' | B2' | — | — | — |
| 3 | — | — | — | B3 | B3 | B3 | — | — | B3' | B3' | B3' | — |
| 4 | — | — | — | — | B4 | B4 | B4 | B4 | — | B4' | B4' | B4' |
| CELL 1 | — | B1 | B2 | B2 | B4 | B4 | B4 | B4 | B3' | B3' | B3' | B1" |
| CELL 2 | — | — | — | B3 | B3 | B3 | B1' | B2' | B2' | B4' | B4' | B4' |

Table 2 for D = 3 and I = 5

| L/T | 0 | 1 | 2 | 3 | 4 | 0' | 1' | 2' | 3' | 4' | 0" | 1" | 2" | 3" | 4" |
|---|---|---|---|---|---|---|---|---|---|---|---|---|---|---|---|
| 0 | — | — | — | — | — | — | — | — | — | — | — | — | — | — | — |
| 1 | — | B1 | B1 | — | — | — | B1' | B1' | — | — | — | B1" | B1" | — | — |
| 2 | — | — | B2 | B2 | B2 | B2 | — | B2' | B2' | B2' | B2' | — | B2" | B2" | B2" |
| 3 | — | — | — | B3 | B3 | B3 | B3 | B3 | B3 | B3' | B3' | B3' | B3' | B3" | B3" |
|   |   |   |   |   |   |   |   |   | B3' |   |   |   |   | B3' |   |
| 4 | — | — | — | — | B4 | B4 | B4 | B4 | B4 | B4 | B4 | B4 | B4' | B4' | B4" |
|   |   |   |   |   |   |   |   |   |   | B4' | B4' | B4' |   |   | B4' |
| CELL 1 | — | B1 | B1 | B3 | B3 | B3 | B3 | B3 | B4' | B4' | B4' | B4' | B4' | B4' | B4' |
| CELL 2 | — | — | B2 | B2 | B2 | B2 | B1' | B1' | B3' | B3' | B3' | B3' | B3' | B3' | B4" |
| CELL 3 | — | — | — | — | B4 | B4 | B4 | B4 | B4 | B4 | B4 | B4 | B2" | B2" | B2" |
| CELL 4 |   |   |   |   |   | B2' | B2' | B2' | B2' | B1" |   | B1" |   | B3" | B3" |

Examples in Tables 1 and 2 illustrate, for the configurations of FIG. 4 and FIG. 5, respectively, the situation where the minimum number R of RAM cells can be reused. For the situation of D=2, the theoretical minimum number R of memory cells for interleaving is 2, while the time-slot-interchange structure in FIG. 4 uses 10 memory cells. Table 1 illustrates the storage of bytes for the interleaver 400A of FIG. 4 in terms of line number and time. In Table 1, time is indexed over 3 successive interleaving periods, with no prime used for the first period time slots, a single prime for the second period's slots, and a double prime for the two byte intervals shown in the third period. A byte is indexed by the period in which it occurred as B0, B1, B2, B3 or B4 with single and double primes also used. Line 0's bytes (B0, B0', B0", etc.) are always passed immediately at time 0 and therefore never use any memory (and thus line 0 bytes do not appear in Table 1 or Table 2). Hyphens indicate "idle" or empty memory corresponding to initialization of the interleaver.

After byte time 3 of the first interleaver period, the interleaver is in steady state and it is clear that there are never more than 2 bytes stored at any time (presuming the interleaver reads each memory location before writing to it on each byte time slot). As shown in Table 1, two memory cells can be used for this triangular/convolutional interleaver. One half of the bytes in time 1 of the interleave period (called B1 with various primes) are in Cell 1 while the other half of those bytes are in Cell 2. This is true for all bytes, and in general, 1/D of the bytes in any symbol position within a period are in any particular cell. Once steady state is reached, all cells are always full. The deinterleaver also only needs 2 Cells of memory and can be described by letting $$Bi \rightarrow B(I-1-i) \qquad \text{Eq. (5)}$$

everywhere (so B4 passes immediately and then bytes B3, B2, B1 and B0 undergo linearly increasing delay).

Table 2 shows a similar situation for D=3. After time 1 of the second period, the interleaver is in steady state and uses all the minimum of 4 (where the minimum is defined as $$\frac{(D-1) \cdot (I-1)}{2}$$

cells, per above) cells of RAM. Each cell progresses through use on line 1, then line 3, then line 4, and line 2 before rotating back to line 1 again. The process is regular and repeats on the different memory cells offset in time by one period with respect to one another.

A schedule for the use of the minimum number of memory cells can be implemented simply by recognizing that the same cell that is read on any byte period of any period must also be written with the next available input byte with minimum RAM. For a particular specified depth and period, a set of $$\frac{(D-1) \cdot (I-1)}{2}$$

fake RAM cells can be created off-line in software or hardware, each with a time that is set to "alarm" exactly k(D−1) byte periods later where k is the interleaver-input byte-clock index. At each subsequent time period in steady state, one and only one cell's timer will alarm and that cell should be first read and then written and the timer reset to the value of k(D−1). A "which byte when" schedule will then occur for each storage cell that can be stored and used in later operation. The order for the example in Table 2 is provided in Table 3. The ordering is unique to within the $$\left[\frac{(D-1)\cdot(I-1)}{2}\right]!$$

possible ways of labeling memory cells.

TABLE 3

Symbol clocks for "read-then-write" for each cell in Table 2

| Cell | Period 1 | Period 2 | Period 3 | Period 4 |
|------|----------|----------|----------|----------|
| CELL1 | 1, 3 | 4 | — | 2 |
| CELL2 | 2 | 1, 3 | 4 | — |
| CELL3 | — | 2 | 1, 3 | 4 |
| CELL4 | 4 | — | 2 | 1, 3 |

In the minimum-memory implementation described above, the relationship to the triangular structure in the memory connection is still inherent, but it evolves in time to prevent essentially idle memory cells. The structure is no longer triangular, but was derived from knowing the progression of memory use in the triangular structure.

In one embodiment of this invention, a schedule is created for each cell of the interleaver, thus resulting in a total of $$\frac{(D-1)\cdot(I-1)}{2}$$

cells. Such a determination can be performed, if desired, before the interleaver begins its operation with the configured values for depth, D, and I. A cell's schedule can be described as an array with two columns and multiple rows. The first column indicates a period, and the second column indicates a byte within the period that is indicated by the first column. Each row of this array defines the time at which the cell is read (that is, becomes empty) and is immediately afterwards written (that is, becomes full). Exactly one cell becomes empty for each input symbol of the interleaver during steady-state operation. Using the example of Table 3, the schedule for cell 1 can be expressed as:

$$\text{schedule\_cell\_1} = \begin{bmatrix} 1 & 1 \\ 1 & 3 \\ 2 & 4 \\ 4 & 2 \\ 5 & 1 \\ 5 & 3 \\ 6 & 4 \\ 8 & 2 \\ 9 & 1 \\ \vdots & \vdots \end{bmatrix} \quad \text{Eq. (6)}$$

The schedule repeats after row 5; that is, rows 5 to 8 are the same as rows 1 to 4 with only the periods (column 1) being offset by 4. Thus, the schedule array can be represented with a finite number of rows. Again using Table 3, the cell 2 schedule can be:

$$\text{schedule\_cell\_2} = \begin{bmatrix} 1 & 2 \\ 2 & 1 \\ 2 & 3 \\ 3 & 4 \\ 5 & 2 \\ \vdots & \vdots \end{bmatrix} \quad \text{Eq. (7)}$$

The schedule of cell 2 is related to the schedule of cell 1, the difference being that the cell 2 schedule is missing the first 3 rows of the cell 1 schedule, and the 3 period offset (column 1) rather than the cell 1 schedule periods. Such cell schedule similarities are not always present, but if they are, they can be exploited to reduce the storage requirement for cell schedules. The schedules for cells 3 and 4 are expressed as:

$$\text{schedule\_cell\_3} = \begin{bmatrix} 2 & 2 \\ 3 & 1 \\ 3 & 3 \\ 4 & 4 \\ 6 & 2 \\ \vdots & \vdots \end{bmatrix} \quad \text{Eq. (8)}$$

$$\text{schedule\_cell\_4} = \begin{bmatrix} 1 & 4 \\ 3 & 2 \\ 4 & 1 \\ 4 & 3 \\ 5 & 4 \\ \vdots & \vdots \end{bmatrix} \quad \text{Eq. (9)}$$

An interleaver controller module, or a software program accesses the cell schedules and controls which cell is used at each time instant to read a byte from the interleaver and to immediately write a byte to the interleaver. For the cell schedules given above, a controller would perform read/write operations in memory cells as shown in Table 4. (Note that no memory is needed for byte 0 of each period.)

TABLE 4

| | Byte | | | | |
|---|---|---|---|---|---|
| | 0 | 1 | 2 | 3 | 4 |
| Period 1 | — | Cell 1 | Cell 2 | Cell 1 | Cell 4 |
| Period 2 | — | Cell 2 | Cell 3 | Cell 2 | Cell 1 |
| Period 3 | — | Cell 3 | Cell 4 | Cell 3 | Cell 2 |
| Period 4 | — | Cell 1 | Cell 2 | Cell 1 | Cell 4 |
| ... | ... | ... | ... | ... | ... |

For a specific cell, a schedule can be obtained using the pseudo-code shown next, which is described in more detail below.

| D = 4; | % interleaver depth |
| I = 15; | % interleaver period |
| p_start = 0; | % starting period |
| b_start = 1; | % starting byte of period |

-continued

```
idx = 1;          % index for schedule rows
% Initialize schedule
schedule(idx,1) = p_start;
schedule(idx,2) = b_start;
idx = idx + 1;
% Iterate until the schedule repeats
done_flag = 0;
period_idx = p_start;
byte_idx = b_start;
while done_flag == 0
    % Find next instant when cell empties
    byte_idx = byte_idx + byte_idx*(D−1);
    period_idx = period_idx + floor(byte_idx / I);
    byte_idx = rem(byte_idx, I);
    schedule(idx,1) = period_idx;
    schedule(idx,2) = byte_idx;
    if schedule(idx,2) == b_start
        done_flag = 1;
    end;
    idx = idx + 1;
end;
```

Figure 7:
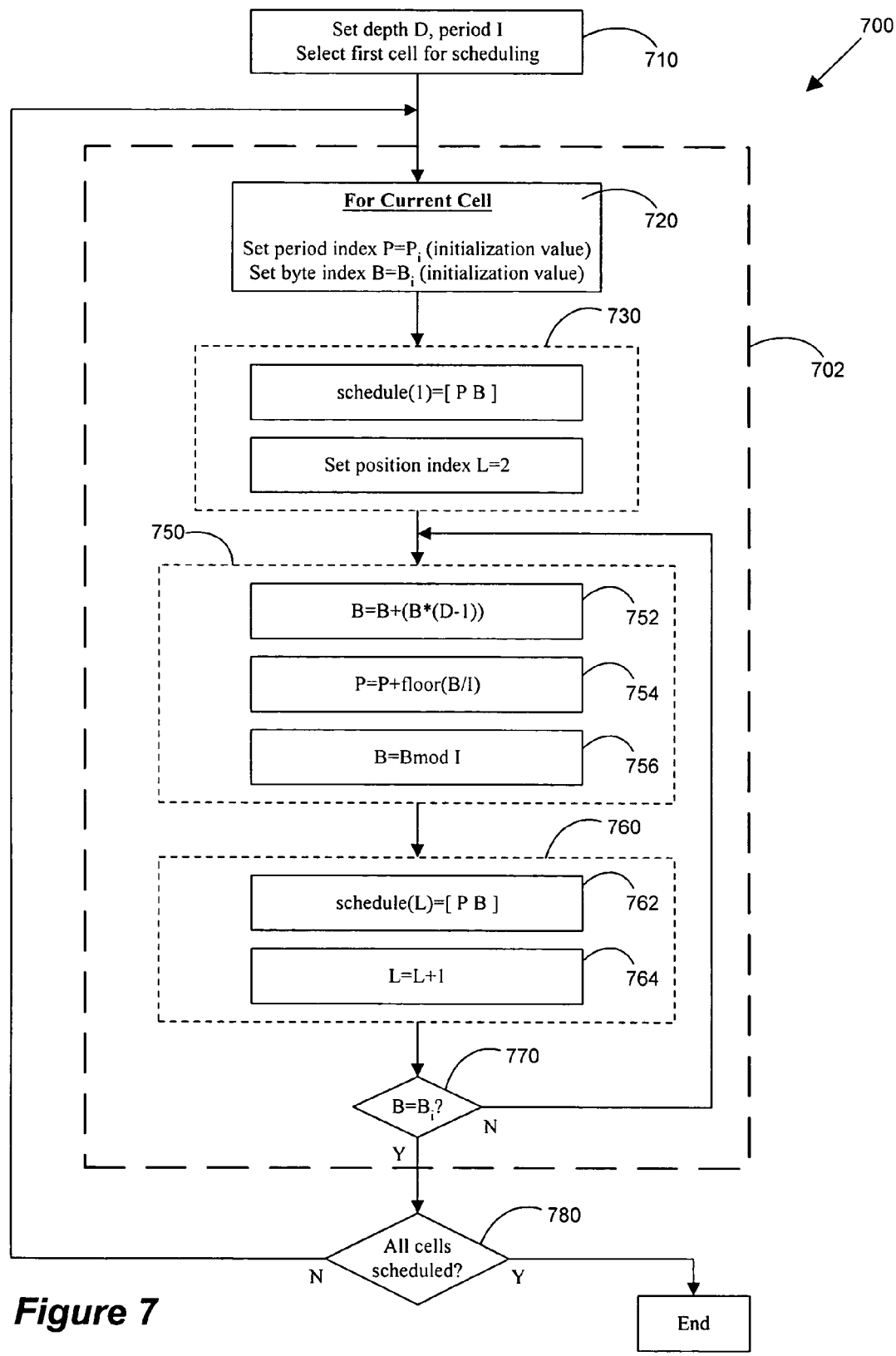
FIG. 7 is a method according to one or more embodiments of the present invention for scheduling memory cells in an interleaver/deinterleaver system.

One method to find the schedule of a cell was described by pseudo-code above. Another method 700 according to one or more embodiments of the present invention for scheduling cell emptying/filling (that is, performing read and write operations on cells) is shown in FIG. 7. The depth D and period I parameters of the interleaver (that is, applicable to all cells) are set for at 710, at which point a first cell for scheduling also is selected. A sub-method 702 that is applied to each cell then commences and is executed for each cell in the interleaver. A period index P represents the number of the period in which the cell is emptied/filled. Likewise, a byte index B represents the byte number within each period which the cell is emptied/filled.

The period index initialization value $P_i$ and the byte index initialization value $B_i$ for the cell of interest are set at 720 to establish when a "first byte" will fill the current cell. The first row of the schedule (that is, schedule position/row index=1) is defined at 730 by assigning the first column (a first element) to equal the period index initialization value and the second column (the second element) to equal the byte index initialization value. In this embodiment of the present invention, the position (row) index L also is incremented to 2 at 730.

A new schedule row is generated at 750, which can be performed in a variety of ways, as will be appreciated by those skilled in the art. As seen in FIG. 7, in some embodiments the period index P and byte index B are updated, which can include generating a temporary new byte index at 752 (for example, by adding to the current byte index the quantity of the byte index multiplied by (D−1)), followed by generating a new period index at 754 (for example, updated by incrementing the current period index by the result of the integer division of the new byte index by the interleaver period—that is, the floor function of that quotient), followed by any needed re-definition of the temporary new byte index (for example, using mod I, where the remainder of the integer division of the temporary new byte index by the interleaver period gives the redefined new byte index) at 756. Other sub-methods for generating schedule rows will be apparent to those skilled in the art.

At 760 the next row of the schedule (that is, row L) is then formed by assigning the current period index P to the first element and the current byte index B to the second element at 762, after which the position/row index is incremented at 764. If the current byte index is not equal to the start byte index $B_i$ at 770, then method 700 returns to 750 to continue constructing the current cell's schedule. If the current byte index value is equal to the byte index initialization value, then all needed schedule row information has been generated for the given cell. At 780 the method 700 checks to see if all cells have been scheduled. If so, then method 700 ends. If not, a new cell is selected and method 700 returns to sub-method 702 and initializes at 720 for the new cell. The schedule of the next cell is created by choosing a start period index and start byte index pair that differs from any period index and byte index pair appearing in any row of the already created schedules. Method 700 thus continues until schedules have been created for $$\frac{(D-1) \cdot (I-1)}{2}$$

cells.

Thus, interleaving and interleavers according to the present invention (with dummy bytes if interleaver depth and period are not co-prime) allow DSL interleaving to be implemented with any depth and period, and with minimum memory, if desired. Interleavers according to embodiments of the present invention also can maintain the absolute minimum memory requirement while allowing graceful change during operation of the interleaver depth between values that maintain co-prime constraints.

Depth changes are desirable in DSL systems for a number of reasons and are necessary when the net data rate on a latency path of a DSL system changes during "SHOWTIME" (while delay must remain the same or approximately the same). Such changes to the net data rate of a DSL system may be part either of a Seamless Rate Adaptation (SRA) procedure, in which case the sum of the net data rate over all latency paths changes, or it may be part of a Dynamic Rate Repartitioning (DRR) procedure, in which case a portion of the net data rate of one latency path is reassigned to another latency path. One objective of such changes is to preserve the delay as a constant or approximate constant. In the VDSL2 recommendation, for example, delay is expressed as:

$$\text{Delay} = (D-1)(I-1)\text{bytes} = \frac{S(D-1)}{q \cdot f_s}\left(1 - \frac{q}{N}\right) ms \qquad \text{Eq. (10)}$$

In the above expression, q is the number of interleaver blocks per RS codeword, $f_s$ is the number of DMT frames per second, N is the RS codeword size, and S is the number of DMT frames per RS codeword. Increasing the net data rate (for example, by decreasing S, and/or by increasing N) has the effect of decreasing the delay as expressed in milliseconds. In order to maintain a constant delay, the depth D thus needs to be increased. The opposite effect takes place when the net data rate is decreased, and the opposite correction is then required for D; that is, it must be decreased.

The VDSL2 recommendation presently defines a procedure for implementing a depth change for an interleaver. Embodiments of the present invention can implement such a depth change while always maintaining interleaver/deinterleaver minimum memory. This is a significant advancement compared to prior interleaver implementations that claim to be minimum memory implementations. Such earlier implementations require memory allocation for the maximum planned interleaver depth and thus do not maintain minimum memory for the interleaver during those times when the interleaver depth is smaller than the maximum planned interleaver depth.

When the depth decreases from D to D' (where the new depth is D' and the old depth is D), then the VDSL2 recommendation specifies that no write operations shall be performed for a transition period equal to:

$$\delta = \left\lceil \frac{(D-D') \cdot (I-1)}{I} \right\rceil \cdot I \text{ bytes} \qquad \text{Eq. (11)}$$

During this time the interleaver read operations continue to be performed on cells as before. At any time before the end of the transition period, the interleaver output bytes experience a delay based on depth D. After the end of the transition period, the interleaver output bytes experience a delay that corresponds to a new depth D' performing read and write operations on memory cells.

When the depth increases from D to D', then the VDSL2 recommendation specifies no transition period. Prior to the depth increase, the interleaver output bytes experience a delay that corresponds to an initial depth D. After the depth increase, the interleaver output bytes experience a delay that corresponds to the new depth D'.

Such depth changes can be implemented in an efficient manner through a minimum-memory cell-based interleaver/deinterleaver implementation of this invention. As described earlier, the period I and the initial depth D are used to generate a schedule for each of the $$\frac{(D-1) \cdot (I-1)}{2}$$

cells. If the depth needs to change to D', then a new schedule must first be generated for a number of cells equal to $$\frac{(D'-1) \cdot (I-1)}{2}.$$

One benefit of the present invention is that the number of cells can always be adjusted to be equal to the minimum number necessary.

Figure 8A:
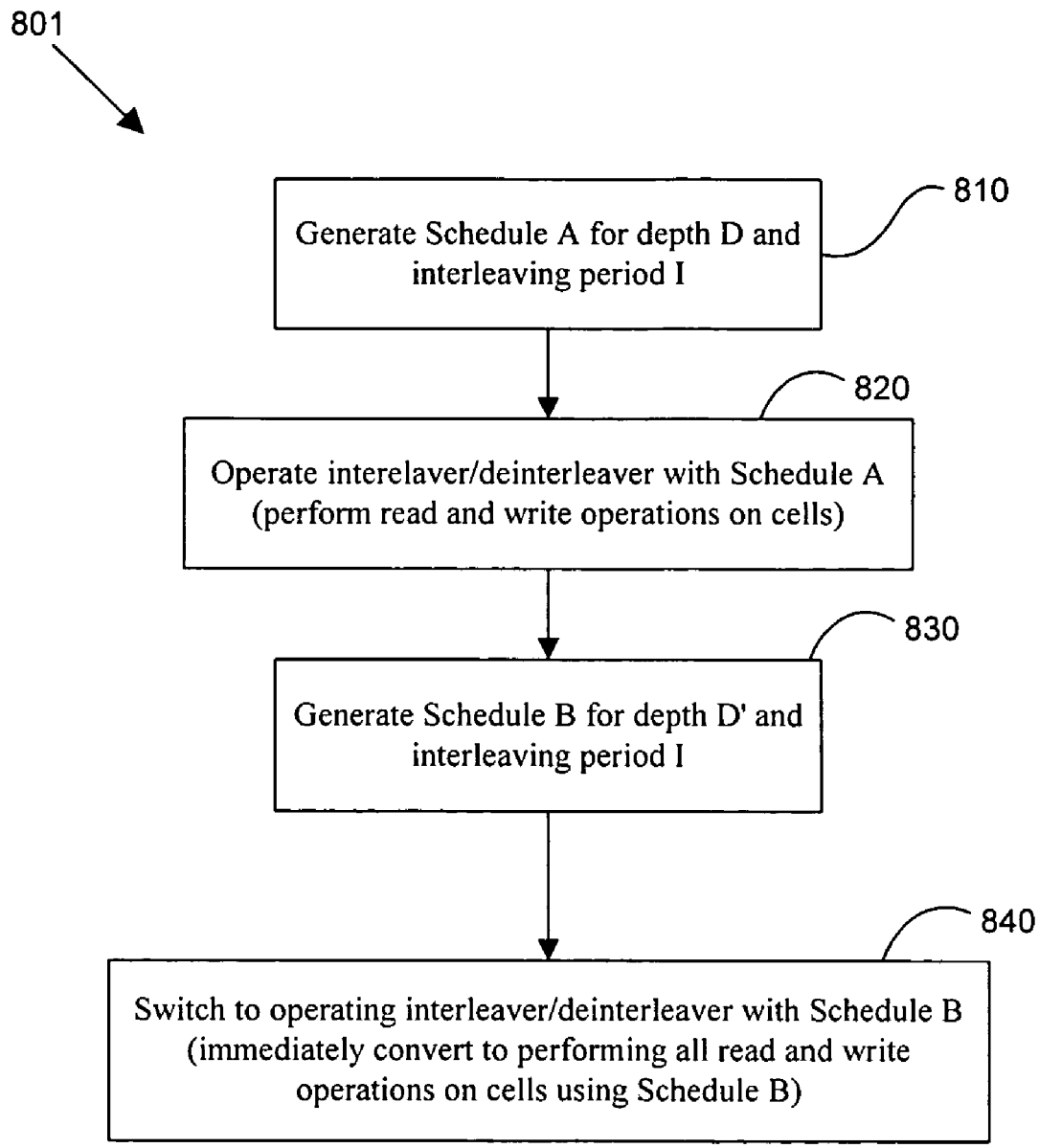
FIG. 8A is a method according to one or more embodiments of the present invention showing dynamic adjustment of interleaving/deinterleaving when the interleaving depth is decreased.
Figure 9:
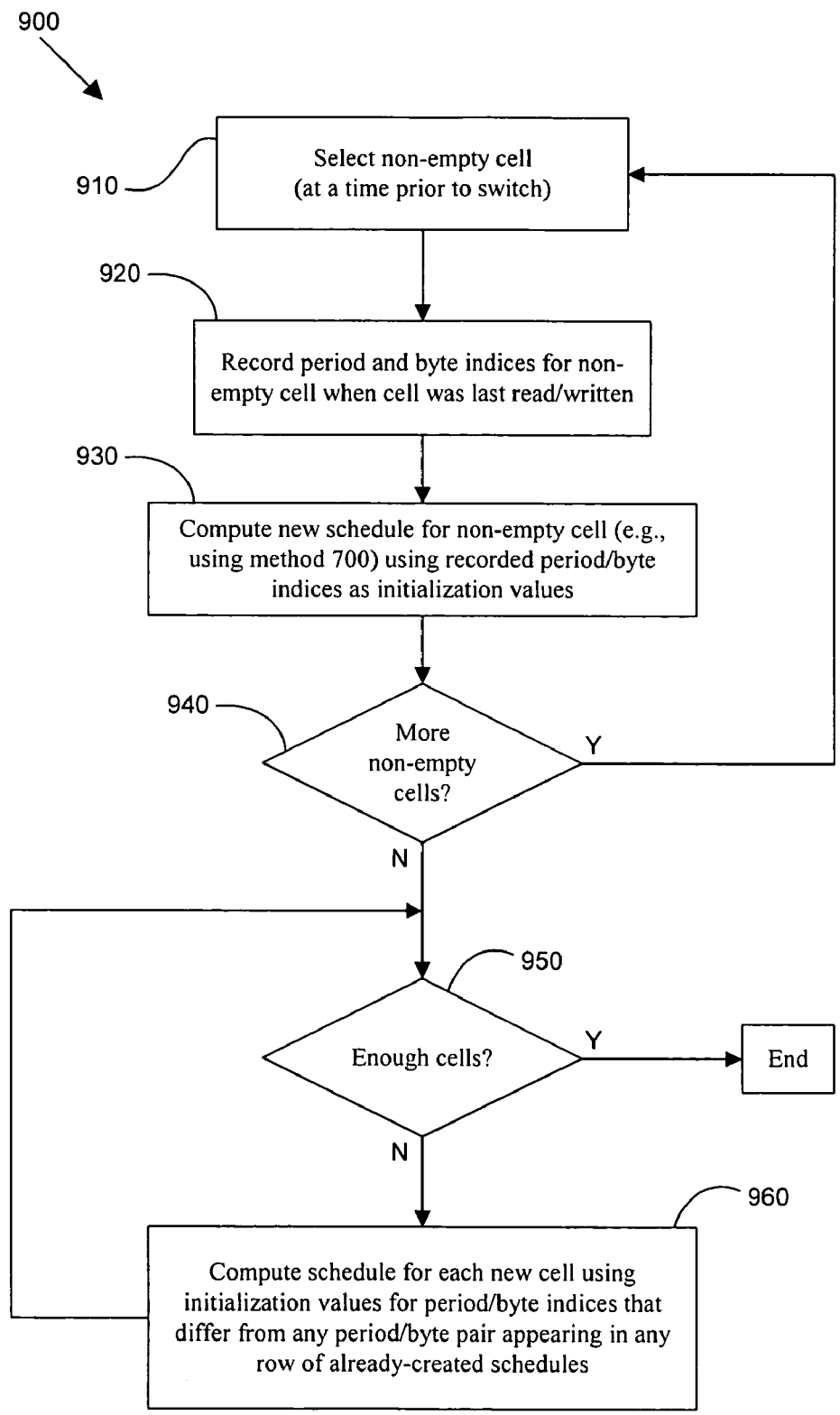
FIG. 9 is a method according to one or more embodiments of the present invention showing the generation of a new schedule and/or schedule set for use during dynamic adjustment of interleaving/deinterleaving.

In the case of a depth increase, FIG. 8A shows a method 801 according to one or more embodiments of the present invention. Schedule A is generated at 810, corresponding to depth D and period I. The interleaver/deinterleaver operates normally at 820, performing read and consequent write operations on cells according to Schedule A. When a depth increase command is received, then a new Schedule B is generated at 830 corresponding to depth D' and period I. One method of creating a Schedule B is shown in FIG. 9, discussed in more detail below. The depth increase is applied by having the interleaver/deinterleaver operate in normal mode, immediately switching to performing read and consequent write operations on cells according to Schedule B at 840. No transition period is needed since there is no conflict between Schedules A and B when the depth is increased.

Figure 8B:
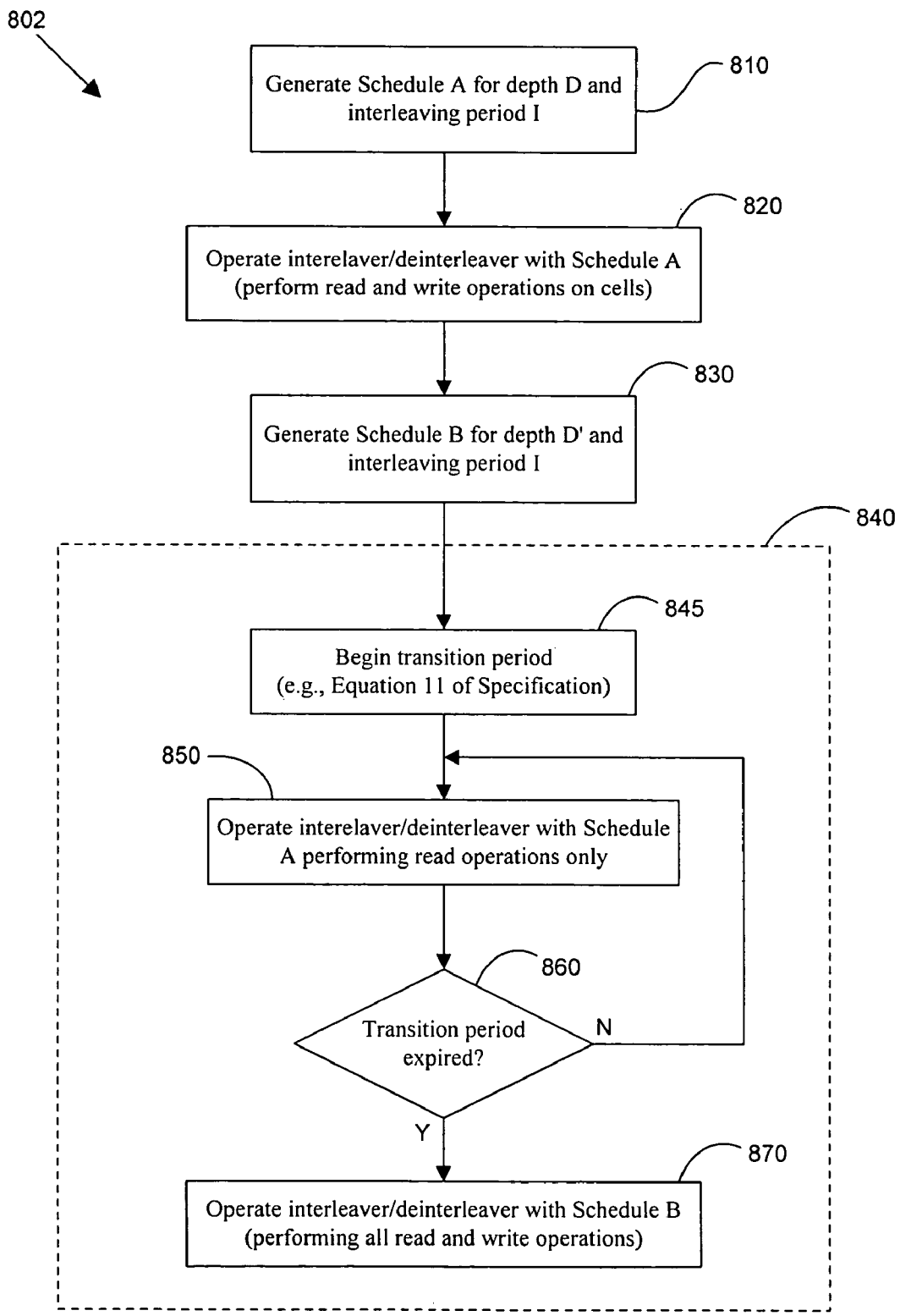
FIG. 8B is a method according to one or more embodiments of the present invention showing dynamic adjustment of interleaving/deinterleaving when the interleaving depth is increased.

In the case of a depth decrease, FIG. 8B shows a method 802 according to one or more embodiments of the present invention. As with the depth increase of FIG. 8A, at 810 Schedule A is generated corresponding to depth D and period I. The interleaver/deinterleaver then operate(s) normally at 820, performing read and consequent write operations on cells according to Schedule A. When a depth decrease command is received, then a new Schedule B is generated at 830 (again, for example, according to the method of FIG. 9) corresponding to depth D' and period I. Switching at 840 to new Schedule B using the depth decrease is initiated at 850, after a transition period begins at 845, during which the interleaver/deinterleaver still operates according to Schedule A, but performs only read operations on cells, no write operations. Finally, after the end of the transition period is determined at 860, the interleaver/deinterleaver operate(s) normally at 870, performing read and consequent write operations on cells according to Schedule B.

One embodiment of a method 900 for generating a Schedule B, above, is shown in FIG. 9. At 910 a non-empty cell is selected (at a time that may just precede the switch to a new schedule). At 920 method 900 records the period index and byte index when the non-empty cell was last read/written. Using the recorded period and byte indices from 920 at initialization values, method 900 then computes at 930 a new schedule (using, for example, the method of FIG. 7). If more non-empty cells are available at 940, then method 900 returns to 910 compute another non-empty cell's schedule. If no other non-empty cells are available at 940, then method 900 determines at 950 whether more cells are needed. In the case of minimum-memory usage, this means determining whether there are $$\frac{(D'-1) \cdot (I-1)}{2}$$

cells. If no more cells are needed, then method can terminate.

Otherwise, at 960 method 900 computes a schedule for a new cell. This can be done, for example, using the method of FIG. 7 and starting with any period/byte index pair not present in the already-scheduled cells as initialization values. Once this the new schedule has been computed at 960, method 900 can return to 950 to determine whether more cells are needed. Much of the information needed for method 900 can easily be extracted from Schedule A.

Figure 10:
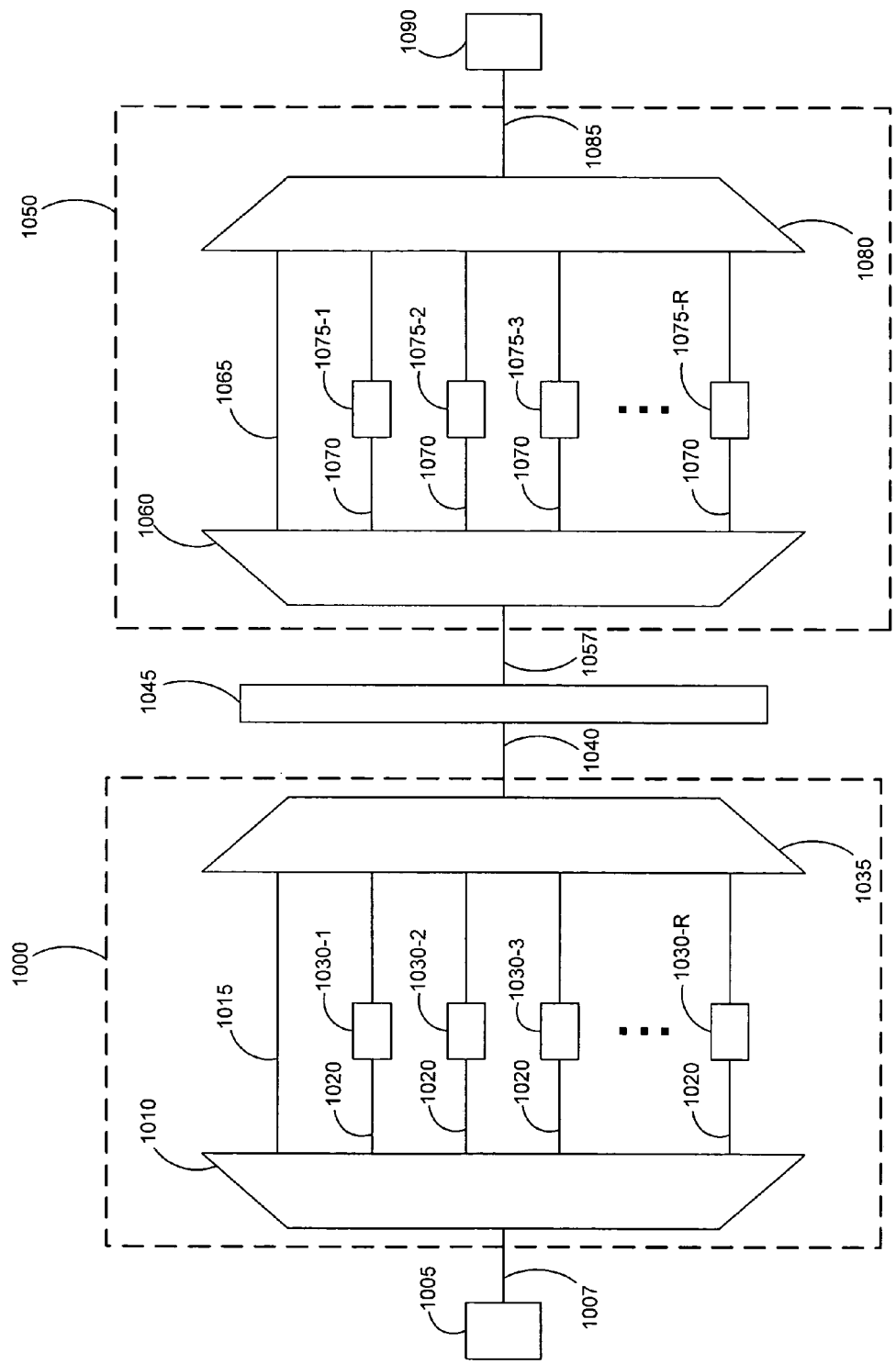
FIG. 10 is a schematic block diagram of a memory-cell based implementation of the minimum-memory interleaving system, etc. embodiments of the present invention.

One embodiment of the present invention showing the minimum-memory configuration is shown in FIG. 10. Data from a source 1005 is send via a device input 1007 to a multiplexer 1010. The output of multiplexer 1010 includes a single pass-through line 1015 and R delay lines 1020, where $$R = \frac{(D-1) \cdot (I-1)}{2}.$$

Each delay line has a variable-hold memory cell 1030-1, 1030-2, . . . , 1030-R. Each line 1015, 1020 of the interleaver 1000 is an input to a second multiplexer 1035. Multiplexer 1035 operates to implement one or more of the interleaving methodologies discussed above, either taking a byte that has been sent on pass-through line 1015, or seeking the stored byte in a memory cell that is due for writing to the device output after being held in the cell 1030 for a delay of k(D−1). Multiplexer 1035 can search for the cell or line that requires attention and the appropriate byte can be written to the output of multiplexer 1035, which is also the output of interleaver 1000. The interleaver output 1040 then allows the byte stream to be transmitted on channel 1045, though some additional processing may take place between interleaver output 1040 and transmission.

Deinterleaver 1050 operates in a similar manner using input 1057, first multiplexer 1060, pass-through line 1065, delay lines 1070 which each have a variable-hold memory cell 1075-1, 1075-2, . . . , 1075-R, second multiplexer 1080, and output 1085. Data arriving on input 1057 may have been processed after transmission. Deinterleaved data is delivered to a buffer or other location 1090. Each byte being delivered to the deinterleaver 1050 is delayed for any further time required to make its total delay in interleaver 1000 and deinterleaver 1050 (D−1)(I−1). Therefore, a byte that went to pass-through line 1015 in interleaver 1000 is held for a delay of (D−1)(I−1) in one of the deinterleaver's cells 1075. Where a byte has k=I−1, then it was held for (D−1)(I−1) in interleaver 1000 and will be sent to the pass-through line 1065 of deinterleaver 1050. Operation of the interleaver 1000 and deinterleaver 1050 is readily understood by those skilled in the art after reviewing the present disclosure.

Figure 11:
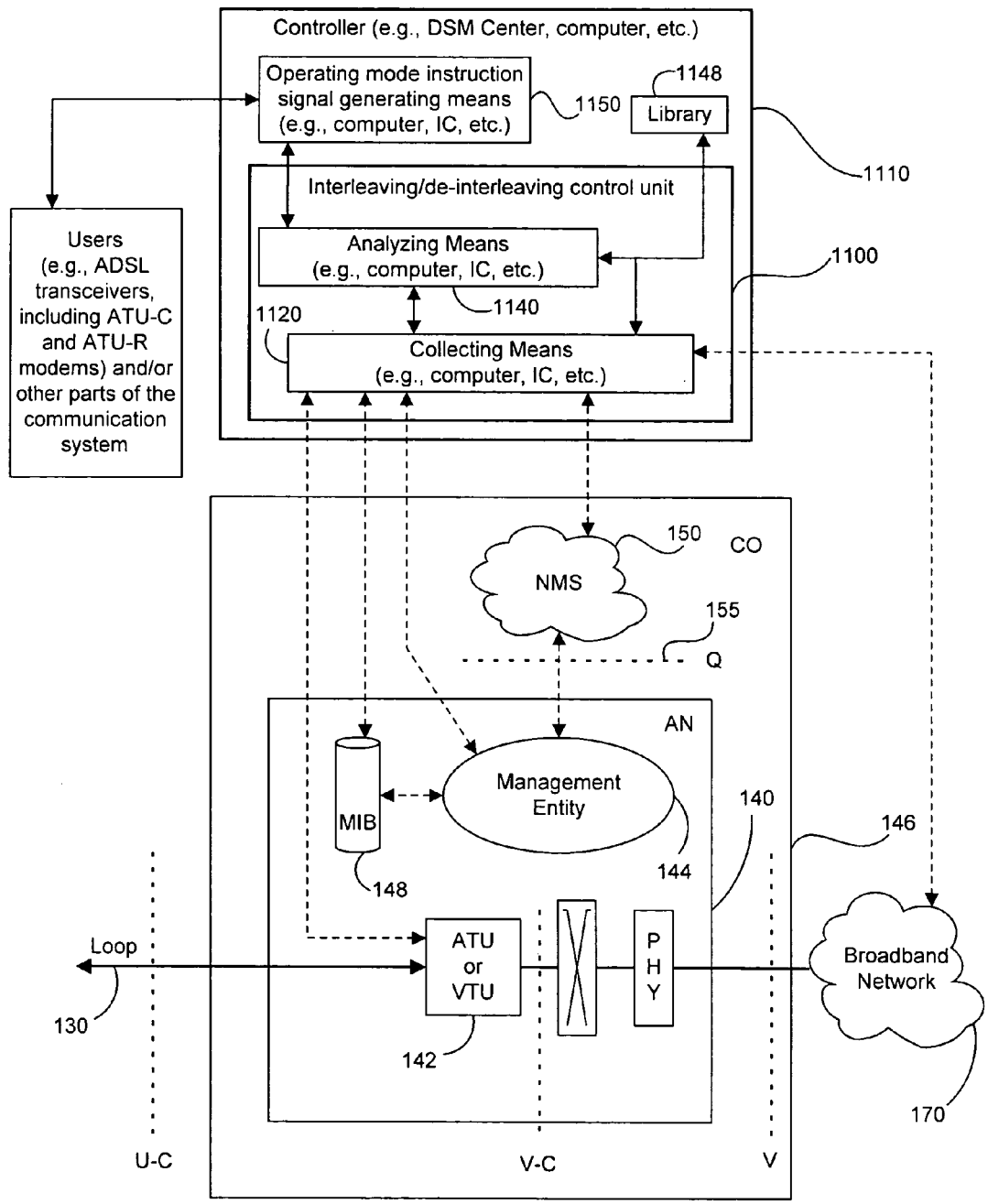
FIG. 11 is a controller including an interleaver/deinterleaver control unit according to one embodiment of the present invention.

According to one embodiment of the present invention shown in FIG. 11, an interleaving/deinterleaving control unit 1100 may be part of an independent entity coupled to a DSL or other communication system, such as a controller 1110 (for example, a device functioning in a user's local equipment or a remote location controller as described above) assisting one or more users of the system. A remote controller not located in a CO, telco, etc. may also be referred to as a dynamic spectrum manager, Dynamic Spectrum Management Center, Interleaver Implementation Module, User Assistance Center, DSM Center, System Maintenance Center, SMC or any other similar name. In some embodiments, the controller 1110 may be a completely independent entity. In other embodiments, the controller 1110 can be part of the user's equipment or connected to user equipment to collect data in a manner similar to that described herein with regard to the collection of data from other parts of a DSL or other communication system. Moreover, controller 1110 may be coupled to and/or controlling DSL and/or other communication lines of multiple users.

The interleaving/deinterleaving control unit 1100 includes a data collection unit 1120 identified as a collecting means and an analysis unit 1140 identified as analyzing means. As seen in FIG. 11, the collecting means 1120 (which can be a computer, processor, IC, computer module, etc. of the type generally known) may be coupled to NMS 150, ME 144 or AN 140, a modem, a transceiver and/or the MIB 148 maintained by ME 144, any or all of which may be part of a DSL system for example. The collecting means 1120 may also be directly coupled to the ATU or VTU 142. Where the controller 1110 is implemented at a user's location, the controller 1110 may be a computer such as a home PC or the like running software or other computer program products that control and assist with communications. Data also may be collected through a broadband network 170 (for example, via the TCP/IP protocol or other protocol or means outside the normal internal data communication within a given DSL system).

One or more of these connections allows the interleaving/deinterleaving control unit 1100 to collect operational data from a user's line, if desired, and elsewhere (possibly the broader system), if appropriate. Data may be collected once or over time. In some cases, the collecting means 1120 will collect on a periodic basis, though it also can collect data on-demand or any other non-periodic basis (for example, when a DSLAM or other component sends data to the preference-based control unit), thus allowing the preference-based control unit 1100 to update its information, operation, etc., if desired. Data collected by means 1120 is provided to the analyzing means 1140 (which also can be a computer, processor, IC, computer module, etc. of the type generally known) for analysis and any decision regarding one or more operational and/or performance metrics and/or the dynamic adjustment of any interleaving/deinterleaving functions in the communication system.

In the exemplary system of FIG. 11, the analyzing means 1140 is coupled to a signal generating means 1150 in the controller 1110. This signal generator 1150 (which can be a computer, processor, IC, computer module, etc.) is configured to generate and send instruction signals to the user's modem and/or other components of the user's link to the communication system. These instructions may include instructions regarding data rates, transmit power levels, coding and latency requirements, interleaving/deinterleaving operational parameters, interleaving/deinterleaving parameter changes, etc.

Embodiments of the present invention can utilize a database, library or other collection of data pertaining to data collected, etc. This collection of reference data may be stored, for example, as a library 1148 in the controller 1110 of FIG. 11 and used by the analyzing means 1140 and/or collecting means 1120. The controller 1110 also may access one or more libraries and/or databases outside the controller 1110, as will be appreciated by those skilled in the art.

In some embodiments of the present invention, the interleaving/deinterleaving control unit 1100 may be implemented in one or more computers such as PCs, workstations or the like and/or in one or more computer program products. The collecting means 1120 and analyzing means 1140 may be software modules, hardware modules or a combination of both, as will be appreciated by those skilled in the art. When working with a large numbers of modems, lines, users, etc., databases may be introduced and used to manage the volume of data collected.

Generally, embodiments of the present invention employ various processes involving data stored in or transferred through one or more computer systems, which may be a single computer, multiple computers and/or a combination of computers (any and all of which may be referred to interchangeably herein as a "computer" and/or a "computer system"). Embodiments of the present invention also relate to a hardware device or other apparatus for performing these operations. This apparatus may be specially constructed for the required purposes, or it may be a general-purpose computer and/or computer system selectively activated or reconfigured by a computer program and/or data structure stored in a computer. The processes presented herein are not inherently related to any particular computer or other apparatus. In particular, various general-purpose machines may be used with programs written in accordance with the teachings herein, or it may be more convenient to construct a more specialized apparatus to perform the required method steps. A particular structure for a variety of these machines will be apparent to those of ordinary skill in the art based on the description given below.

Embodiments of the present invention as described above employ various process steps involving data stored in computer systems. These steps are those requiring physical manipulation of physical quantities. Usually, though not necessarily, these quantities take the form of electrical or magnetic signals capable of being stored, transferred, combined, compared and otherwise manipulated. It is sometimes convenient, principally for reasons of common usage, to refer to these signals as bits, bitstreams, data signals, control signals, values, elements, variables, characters, data structures or the like. It should be remembered, however, that all of these and similar terms are to be associated with the appropriate physical quantities and are merely convenient labels applied to these quantities.

Further, the manipulations performed are often referred to in terms such as identifying, fitting or comparing. In any of the operations described herein that form part of the present invention these operations are machine operations. Useful machines for performing the operations of embodiments of the present invention include general purpose digital computers or other similar devices. In all cases, there should be borne in mind the distinction between the method of operations in operating a computer and the method of computation itself. Embodiments of the present invention relate to method steps for operating a computer in processing electrical or other physical signals to generate other desired physical signals.

Embodiments of the present invention also relate to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 12:
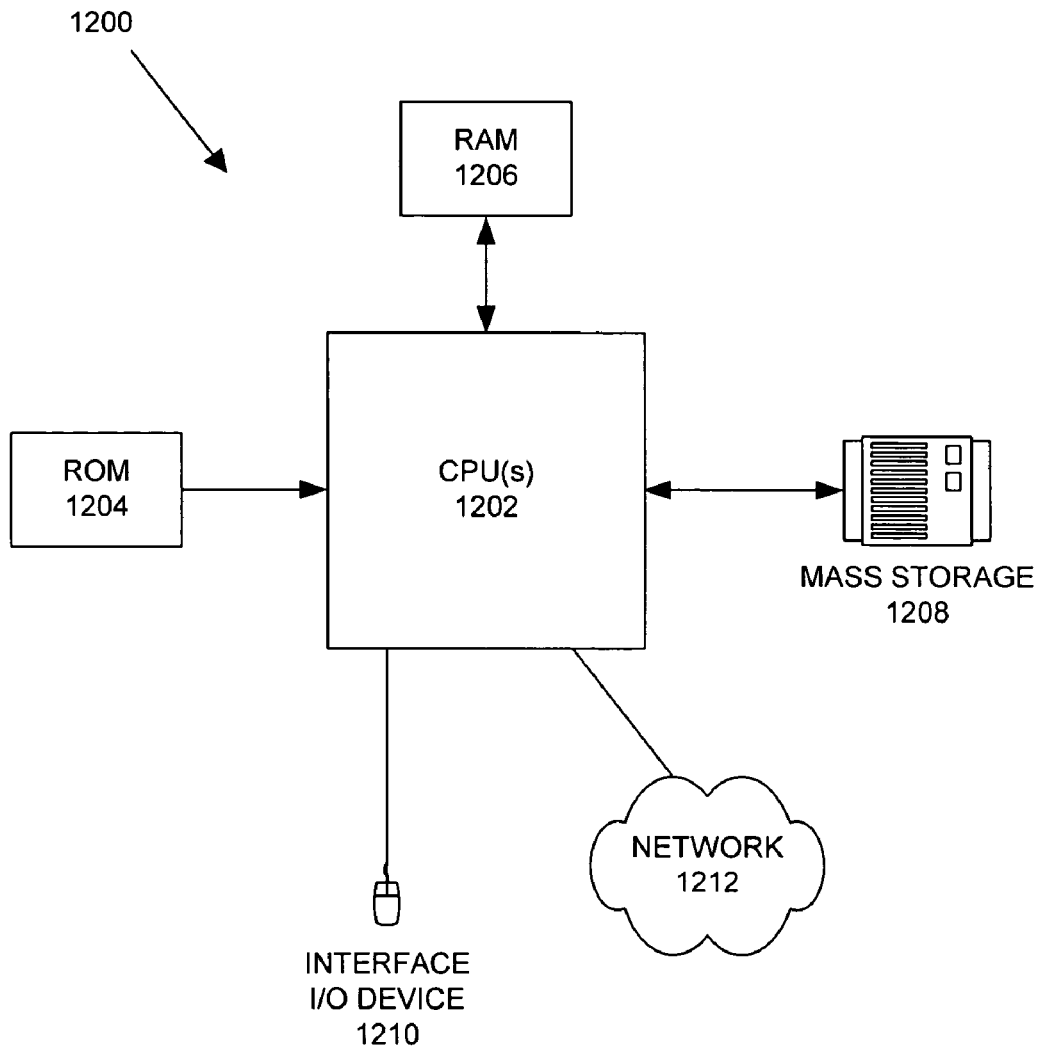
FIG. 12 is a block diagram of a typical computer system or integrated circuit system suitable for implementing embodiments of the present invention.

FIG. 12 illustrates a typical computer system that can be used by a user and/or controller in accordance with one or more embodiments of the present invention. The computer system 1200 includes any number of processors 1202 (also referred to as central processing units, or CPUs) that are coupled to storage devices including primary storage 1206 (typically a random access memory, or RAM), primary storage 1204 (typically a read only memory, or ROM). As is well known in the art, primary storage 1204 acts to transfer data and instructions uni-directionally to the CPU and primary storage 1206 is used typically to transfer data and instructions in a bi-directional manner. Both of these primary storage devices may include any suitable of the computer-readable media described above. A mass storage device 1208 also is coupled bi-directionally to CPU 1202 and provides additional data storage capacity and may include any of the computer-readable media described above. The mass storage device 1208 may be used to store programs, data and the like and is typically a secondary storage medium such as a hard disk that is slower than primary storage. It will be appreciated that the information retained within the mass storage device 1208, may, in appropriate cases, be incorporated in standard fashion as part of primary storage 1206 as virtual memory. A specific mass storage device such as a CD-ROM 1214 may also pass data uni-directionally to the CPU.

CPU 1202 also is coupled to an interface 1210 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1202 optionally may be coupled to a computer or telecommunications network using a network connection as shown generally at 1212. With such a network connection, it is contemplated that the CPU might receive information from the network, or might output information to the network in the course of performing the above-described method steps. The above-described devices and materials will be familiar to those of skill in the computer hardware and software arts. The hardware elements described above may define multiple software modules for performing the operations of this invention. For example, instructions for running a codeword composition controller may be stored on mass storage device 1208 or 1214 and executed on CPU 1202 in conjunction with primary memory 1206. In a preferred embodiment, the controller is divided into software submodules.

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation as illustrated and described. Therefore, the described embodiments should be taken as illustrative and not restrictive, and the invention should not be limited to the details given herein but should be defined by the following claims and their full scope of equivalents, whether foreseeable or unforeseeable now or in the future.

What is claimed is:

1. A method for performing convolutional interleaving or deinterleaving of a data flow, with a depth D and a period I, the method comprising:

determining a schedule for each of a plurality of R memory cells based on an array having a plurality of rows, each row comprising a first element defining a period index P and a second element defining a byte index B, wherein the array is constructed by:

generating a first row of the array, comprising:
setting the first element of the first row of the array equal to a period index initialization value;
setting the second element of the first row of the array equal to a byte index initialization value;

generating a next row of the array, comprising:
setting P equal to the period index initialization value;
setting B equal to the byte index initialization value;
setting a position index L equal to one of the following:

B+(B*(D−1)); or

B+((I−1−B)*(D−1));

resetting P, wherein P is one of the following:

$$P = P + \left\lfloor \frac{B}{I} \right\rfloor$$

when the position index L equals B+(B*(D−1)); or $$P = P + \left\lfloor \frac{L}{I} \right\rfloor$$

when the position index L equals B+((I−1−B)* (D−1));

resetting B, wherein B=L mod I;
setting the first element of the next row of the array equal to P; and setting the second element of the next row of the array equal to B; and
repeating generating the next row of the array until the second element of the next row of the array equals the second element of the first row of the array;
performing for each time sample the following operations:
selecting a first memory cell from the R memory cells based on the schedules of the R memory cells;
reading a first byte stored in the first memory cell;
writing the first byte to the interleaver output;
receiving a second byte at the input of the interleaver;
writing the second byte to the first memory cell.

2. The method of claim 1 wherein selecting a first memory cell from the R memory cells based on the schedules of the R memory cells comprises examining the schedules of the R memory cells to identify the memory cell whose schedule includes a current time sample.

3. The method of claim 1 wherein selecting a first memory cell from the R memory cells based on the schedules of the R memory cells comprises reading a scheduling table, wherein the scheduling table has rows and columns corresponding to period and byte indices, and wherein the contents of the table consist of pointers to memory cells for period/byte index pairs corresponding to time samples.

4. The method of claim 1 wherein $$R = \frac{(D-1)\cdot(I-1)}{2}.$$

5. The method of claim 1, further comprising:
determining a first schedule set for a plurality of R memory cells, wherein:
D is a first depth;
I is an interleaving period; and
R is based on D and I;
performing the read and write operations on the R memory cells using the first schedule set;
determining a second schedule set for a plurality of R' memory cells, wherein:
D' is a second depth; and
R' is based on D' and I; and
switching to read and write operations on the R' memory cells using the second schedule set.

6. The method of claim 5 wherein D' is greater than D; and
further wherein switching to read and write operations on the R' memory cells using the second schedule set comprises transferring from the first schedule set to the second schedule set immediately.

7. The method of claim 5 wherein D' is smaller than D; and
further wherein switching to read and write operations on the R' memory cells using the second schedule set comprises transferring from the first schedule set to the second schedule set using a transition period;
further wherein no interleaver write operations are performed on cells during the transition period;
further wherein interleaver read operations on cells continue before the end of the transition period using an interleaver output byte delay that corresponds to a depth equal to D; and
further wherein interleaver read operations on cells continue after the end of the transition period using an interleaver output byte delay that corresponds to a depth equal to D'.

8. The method of claim 5 wherein determining the first schedule set for R memory cells comprises, for each of the R memory cells, constructing a first schedule set array having a plurality of rows, wherein each row of the array comprises a first element defining a period index P and a second element defining a byte index B, and
further wherein determining the second schedule set for R' memory cells comprises, for each of the R' memory cells, constructing a second schedule set array having a plurality of rows, wherein each row of the array comprises a first element defining a period index P and a second element defining a byte index B.

9. The method of claim 5 wherein performing read and write operations on the R memory cells using the first schedule set comprises selecting a first memory cell from the R memory cells based on the first schedule set; and
further wherein performing read and write operations on the R' memory cells using the second schedule set comprises selecting a first memory cell from the R' memory cells based on the second schedule set.

10. The method of claim 5 wherein $$R = \frac{(D-1)\cdot(I-1)}{2};$$

and further wherein $$R' = \frac{(D'-1)\cdot(I-1)}{2}.$$

11. A system for performing convolutional interleaving of a data flow, with a depth D and a period I, the system comprising:
means for determining a schedule for each of a plurality of R memory cells based on an array having a plurality of rows, each row comprising a first element defining a period index P and a second element defining a bite index B, wherein the array is constructed by:
generating a first row of the array, comprising:
setting the first element of the first row of the array equal to a period index initialization value;
setting the second element of the first row of the array equal to a byte index initialization value;
generating a new row of the array, comprising:
setting P equal to the period index initialization value;
setting B equal to the byte index initialization value;
setting a position index L equal to one of B+(B*(D−1)) and B+((I−1−B)*(D−1));
resetting P, wherein $$P = P + \left\lfloor \frac{B}{I} \right\rfloor$$

resetting B, wherein B=L mod I;
setting the first element of the next row of the array equal to P; and
setting the second element of the next row of the array equal to B; and
repeating generating the next row of the array until the second element of the next row of the array equals the second element of the first row of the array;
means for performing for each time sample the following operations:
selecting a first memory cell from the R memory cells based on the schedules of the R memory cells;
reading a first byte stored in the first memory cell;

writing the first byte to the interleaver output;
receiving a second byte at the input of the interleaver;
writing the second byte to the first memory cell.

12. The system of claim 11 wherein selecting a first memory cell from the R memory cells based on the schedules of the R memory cells comprises examining the schedules of the R memory cells to identify the memory cell whose schedule includes a current time sample.

13. The system of claim 11 wherein selecting a first memory cell from the R memory cells based on the schedules of the R memory cells comprises reading a schedule table, wherein the scheduling table has rows and columns corresponding to period and byte indices, and wherein the contents of the table consist of pointers to memory cells for period/byte index pairs corresponding to time samples.

14. The system of claim 11 wherein $$R = \frac{(D-1)\cdot(I-1)}{2}.$$

15. The system of claim 11, further comprising:
means for determining a first schedule set for a plurality of R memory cells, wherein:
D is a first depth;
I is an interleaving period; and
R is based on D and I;
means for performing the read and write operations on the R memory cells using the first schedule set;
means for determining a second schedule set for a plurality of R' memory cells, wherein:
D' is a second depth; and
R' is based on D' and I; and
means for switching to read and write operations on the R' memory cells using the second schedule set.

16. The system of claim 15 wherein D' is greater than D; and
further wherein switching to read and write operations on the R' memory cells using the second schedule set comprises transferring from the first schedule set to the second schedule set immediately.

17. The system of claim 15 wherein D' is smaller than D; and
further wherein switching to read and write operations on the R' memory cells using the second schedule set comprises transferring from the first schedule set to the second schedule set using a transition period;
further wherein no interleaver write operations are performed on cells during the transition period;
further wherein interleaver read operations on cells continue before the end of the transition period using an interleaver output byte delay that corresponds to a depth equal to D; and
further wherein interleaver read operations on cells continue after the end of the transition period using an interleaver output byte delay that corresponds to a depth equal to D'.

18. The system of claim 15, wherein determining the first schedule set for R memory cells comprises, for each of the R memory cells, constructing a first schedule set array having a plurality of rows, wherein each row of the array comprises a first element defining a period index P and a second element defining a byte index B, and
further wherein determining the second schedule set for R' memory cells comprises, for each of the R' memory cells, constructing a second schedule set array having a plurality of rows, wherein each row of the array comprises a first element defining a period index P and a second element defining a byte index B.

19. The system of claim 15 wherein performing read and write operations on the R memory cells using the first schedule set comprises selecting a first memory cell from the R memory cells based on the first schedule set; and
further wherein performing read and write operations on the R' memory cells using the second schedule set comprises selecting a first memory cell from the R' memory cells based on the second schedule set.

20. The system of claim 15 wherein $$R = \frac{(D-1)\cdot(I-1)}{2};$$

and further wherein $$R' = \frac{(D'-1)\cdot(I-1)}{2}.$$

* * * * *

UNITED STATES PATENT AND TRADEMARK OFFICE
CERTIFICATE OF CORRECTION

PATENT NO. : 7,657,818 B2 Page 1 of 1
APPLICATION NO. : 11/363769
DATED : February 2, 2010
INVENTOR(S) : Cioffi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1009 days.

Signed and Sealed this

Thirtieth Day of November, 2010

David J. Kappos
*Director of the United States Patent and Trademark Office*